(12) United States Patent
Nakamura et al.

(10) Patent No.: US 6,582,862 B1
(45) Date of Patent: Jun. 24, 2003

(54) HIGH PHOTO-SENSITIVITY CURABLE RESIN, PHOTO-CURABLE RESIN COMPOSITION, PRODUCTION METHOD THEREOF, COLOR FILTER AND LIQUID CRYSTAL DISPLAY PANEL

(75) Inventors: Kazuhiko Nakamura, Tokyo-to (JP); Shunsuke Sega, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 11 days.

(21) Appl. No.: 09/680,786

(22) Filed: Oct. 6, 2000

(30) Foreign Application Priority Data

Oct. 8, 1999 (JP) ............................................ 11-288802

(51) Int. Cl.[7] .......................... G02B 5/20; G02F 1/1335; C08F 20/06; C08F 8/14; C08F 8/30

(52) U.S. Cl. .......................... 430/7; 430/287.1; 349/106

(58) Field of Search .................. 430/7, 287.1; 349/106

(56) References Cited

FOREIGN PATENT DOCUMENTS

| EP | 0 977 085 A | * | 2/2000 |
| EP | 1 035 439 A | * | 9/2000 |
| JP | 6-230212 A | * | 8/1994 |

* cited by examiner

*Primary Examiner*—John A. McPherson
(74) *Attorney, Agent, or Firm*—Timothy J. Keefer; Wildman, Harrold, Allen & Dixon

(57) ABSTRACT

An object of the present invention is to provide a high photo-sensitivity curable resin. And another object is to prevent the viscosity increase, or to improve the transparency of said photo-curable resin, if necessary. An isocyanate compound containing a radical polymerizable group is reacted with a raw material polymer having a principal chain comprising an unit having an acid functional group and an unit having a hydroxyl group in the irate of 1.0 or more in terms of the equivalent ratio of the isocyanate group to the hydroxyl groups in said principal chain (NCO/OH). Moreover, when a raw material polymer is produced, its transparency is improved by using an azo polymerization initiator of non-nitrile series or a peroxide-based polymerization initiator. Use of any polymerization inhibitor selected from the groups of compounds shown in formula (9) or formula (15) can also improves transparency when introducing the isocyanate compound into the raw material. Furthermore, viscosity increase can be prevented by treating a photo-curable resin with alcohol. A color layer, protection film, and column-shaped spacer are formed using said photo-curable resin.

40 Claims, 1 Drawing Sheet

HIGH PHOTO-SENSITIVITY CURABLE RESIN, PHOTO-CURABLE RESIN COMPOSITION, PRODUCTION METHOD THEREOF, COLOR FILTER AND LIQUID CRYSTAL DISPLAY PANEL

CROSS REFERENCE TO RELATED APPLICATION

This application claims the priority of Japanese patent application Serial No. P11-288802 filed on Oct. 8, 1999.

BACKGROUND OF THE INVENTION

1. Field of the Invention

The present invention relates to a high photo-sensitivity curable resin that can be hardened(cured) by a little exposure amount, a high photo-sensitivity curable resin composition containing such a photo-curable resin, and a production method thereof.

The present invention also relates to a high photo-sensitivity curable resin having a high as well as a high sensitivity, which has no risk of bringing about undesired increase of the molecular weight or the viscosity in storage, use, or handling, such as a photo-curing resin with a good storage property, and a production method thereof.

The present invention also relates to a photo-curable resin composition containing the photo-curable resin with the high sensitivity and high stability, capable of easily adjusting or evening the film thickness of a coated film without the risk of viscosity increase in storage or coating, and a production method thereof.

Moreover, the present invention relates to a high sensitivity and transparent photo-curable resin, a high sensitivity and transparent photo-curable resin composition containing such a photo-curable resin, and their production methods.

Still further, the present invention relates to a color filter and a liquid crystal display panel with little color irregularity and contrast irregularity, with a protection film of a color layer and a spacer of a liquid crystal layer formed by using the photo-curable resin composition mentioned above.

2. Description of the Related Art

Recently, as a flat display for a personal computer, color liquid crystal display devices have been propagated rapidly. As shown in FIG. 1, a color liquid crystal display device 101, in general, has a structure wherein a color filter 1 and an electrode substrate 2 such as a TFT substrate are faced with each other so as to provide a gap part 3 of about 1 to 10 μm, with a liquid crystal compound L filled in the gap part 3 and the periphery thereof sealed by a sealing member 4. The color filter 1 comprises a structure including a black matrix layer 6 formed in a predetermined pattern for blocking the light in the boundary part between the pixels, a color layer 7 with a plurality of colors (in general, three primary colors including red (R), green (G), and blue (B)) arranged in a predetermined order for forming each pixel or recently, a color filter, a protection film 8, and a transparent electrode film 9 successively laminated on a transparent substrate 5 in this order from the side close to the transparent substrate. Moreover, an alignment layer 10 is provided on the inner surface side of the color filter 1 and the electrode substrate 2 facing thereto. Furthermore, pearls 11 having a constant particle size are dispersed as a spacer in the gap part 3 for constantly and homogeneously maintaining the cell gap between the color filter 1 and the electrode substrate 2. A color image can be obtained by controlling the light transmittance of the pixels colored in each color or the liquid crystal layer behind the color filter.

The protection film 8 formed in the color filter serves for protecting the color layer and for flattening the color filter in the case a color layer is provided in the color filter. In a color liquid crystal display device, in the case the flatness of the transparent electrode film 9 is deteriorated due to existence of gag irregularity derived from the waviness on the surface of the transparent substrate of the color filter, gap irregularity among the R, G and B pixels, or gap irregularity within each pixel, color irregularity or contrast irregularity is generated so as to give rise to a problem of the image quality deterioration. Therefore, a high flatness is required to the protection film.

In the case the fine particle-like pearls 11 as shown in FIG. 1 are dispersed as the spacer, the pearls are dispersed randomly, independent from being behind the black matrix layer 6 or behind the pixels. In the case the pearls are disposed in the display area, that is, in the pixel part, a back lighting beam transmits the pearl part, and further, the orientation of the liquid crystal is disturbed in the vicinity of the pearls so that the display image grade is deteriorated remarkably. Then, as shown in FIG. 2, instead of dispersing the pearls, column-shaped spacers 12 having a height corresponding to the cell gap are formed on the inner surface side of the color filter in the area coinciding with the black matrix layer 6.

The above-mentioned protection film 8 and the column-shaped spacers 12 can be formed with a resin. In consideration of the adhesion property and the sealing property of the sealing part, the protection film 8 is preferably one capable of covering only the area of the transparent substrate with the color layer formed thereon. Moreover, the column-shaped spacers 12 need to be formed accurately in the area with the black matrix layer formed, that is, in the non-display area. Therefore, the protection film and the column-shaped spacers came to be formed with a photo-curing resin capable of easily limiting the area to be hardened by a photo mask.

Furthermore, in the case the surface applied with a photo-curing resin is developed with an organic solvent after exposure for forming the protection film or the column-shaped spacers, since handling and the waste liquid process are troublesome so that it is not satisfactory in terms of economy and stability, a photo-curing resin allowing an alkaline development after exposure has been developed by introducing an acid functional group in a photo-curing resin.

As an alkaline-soluble photo-curing resin, for example, o-cresol novolak epoxy acrylate, or the like, having about 2,000 weight average molecular weight is known. The resin has a carboxylic acid group defining the alkaline solubility. However, since the resin uses a monomer component as an acryloyl group defining the curing property, the reliability in film formation is low. For example, it involves the risk of the residual monomer unit elution to the liquid crystal part. Furthermore, the film thickness may be reduced due to a large amount of the elution in the alkaline development.

Moreover, as all method for introducing a radical polymerizable group such as an acryloyl group into the molecular structure of a compound or providing the photo curing property, for example, a method Of introducing a radical polymerizable group such as a methacryloyl group to an end by reacting of diols with excessive diisocyanate for preparing a reaction product with an isocyanate group remaining on the end, and reacting the isocyanate group of the reaction product with 2-hydroxyl ethylmethacrylate for producing urethane acrylate, is known. However, according to the method, as a principle, a (meth)acryloyl group can be introduced to only both ends of the molecular structure. Furthermore, although a method of radical polymerization by partially containing a compound having two or more radical polymerizable groups in a molecular such as a (meth)acryloyl group can be conceivable, the content of the radical polymerizable group cannot be controlled as well as a problem of gellation is also involved.

As mentioned above, although it is convenient to form the protection film and the column-shaped spacers of a color film with a photo-curing resin, it is difficult to control the amount of the alkaline soluble group such as a carboxyl group and the radical polymerizable group such as a (meth) acryloyl group according to the conventional photo-curing resin in consideration of the curing property and the alkaline solubility thereof.

According to the undisclosed knowledge obtained by the study of the present inventor, since the amount of the alkaline soluble carboxyl group and the radical polymerizable (meth)acryloyl group can be adjusted freely according to a copolymer resin having a principal chain comprising at least a component unit represented by the below-mentioned formula (1) and a component unit represented by the below-mentioned formula (2), with at least a part of the carboxyl group or the hydroxyl group thereof bonded with a (meth) acryloyloxy alkyl isocyanate compound represented by the below-mentioned formula (5) according to reaction of the isocyanate group of the compound, it is extremely suited as a photo-curing resin:

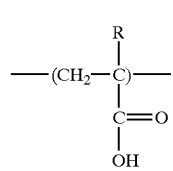

Formula (1)

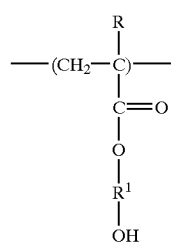

Formula (2)

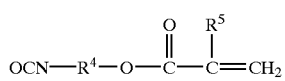

Formula (5)

wherein R is hydrogen or an alkyl group having 1 to 5 carbon atoms, R1 is an alkylene group having 2 to 4 carbon atoms, R4 is an alkylene group, and R5 is hydrogen or methyl.

However, it is learned that in the case the above-mentioned copolymer resin is dissolved or dispersed in a solvent and left, the molecular amount is increased rapidly so as to raise the viscosity According to our experiment, it is confirmed that the thickening phenomenon proceeds even in a room temperature, and proceeds more rapidly as the storage temperature is higher. Moreover, in an experiment utilizing the GPC (gel permeation chromatography), only by dissolving the above-mentioned copolymer resin in a solvent and leaving the same in a room temperature for two weeks, the molecular weight, which was 69,000 at the time of preparation, was increased to as much as 98,000, and the viscosity of the solution became 1.17 times. Furthermore, by storing the copolymer resin at 70° C. for three days, the molecular weight, which was 69,000 at the time of preparation, was increased to as much as 340,000, and the viscosity of the solution became 2.14 times. Moreover, it is also confirmed that the thickening phenomenon becomes further remarkable by mixing the copolymer resin with a thermosetting epoxy resin, an acrylic monomer, a polymerization initiator, or the like, dissolving in a solvent, and storing in the state of a coating liquid to be actually used. Since the above-mentioned copolymer resin cause such a phenomenons of increasing in viscosity, it is the lack of shelf life and is apt to cause coating unevenness.

In particular, the extremely high accuracy and homogeneity are required for the film thickness of the color layer, the protection film for covering the color layer or the height of the column-shaped spacers for ensuring the cell gap. Compared with the color layer and the protection film which is to be formed continuously in a collective area on one side of the substrate, since the column-shaped spacers are formed intermittently according to the black matrix layer formation area by a height more than double as much as the height of the color layer, the size fluctuation can easily be brought about due to increase of the viscosity of the coating liquid. Moreover, in the case the coating resin came to have too high a molecular amount, the shape of the column-shaped spacers is deteriorated so that the strength as a spacer and other dynamic characteristics are deteriorated as well.

Therefore, in the case of forming the color layer, the protection film or the column-shaped spacer of a color filter, in particular, of forming the column-shaped spacer, using a coating liquid of a photo-curing resin composition containing the above-mentioned copolymer resin, the thickening phenomenon of the coating liquid should be prohibited to a minimum level.

Furthermore, a good transparency is required to a resin for forming the color layer or the protection layer of a color filter. However, according to the knowledge of the present inventors, the above-mentioned copolymer resin does not have a sufficient transparency.

SUMMARY OF THE INVENTION

In view of the circumstances, the present invention has been achieved, and a first object thereof is to provide a method of improving the sensitivity of the above-mentioned photo-curable copolymer resin and to provide a photo-curable resin having higher sensitivity than any one obtained conventionally.

A second object of the present invention is to provide a method of improving the shelf life and stability, as well as the sensitivity of the above-mentioned photo-curable copolymer resin and to provide a photo-curable resin which has higher sensitivity than any one obtained conventionally and which is hard to increase in viscosity.

A third object of the present invention is to provide a method of improving the transparency as well as the sensitivity, of the above-mentioned photo-curable copolymer resin, and to provide a photo-curable resin which has higher sensitivity than any one obtained conventionally and which is excellent in transparency.

A forth object of the present invention is to provide a high sensitive photo-curable resin composition containing the above-mentioned improved photo-curable resin.

A fifth object of the present invention is to provide a color filter and a liquid crystal display panel in which a color layer, a protection film and/or a column-shaped spacer in a cell gap are formed by using the above-mentioned improved photo-curable resin composition.

The high photo-sensitivity curable resin to be provided in the present invention comprises a polymer having a principal chain which comprises a constitutional unit having an acid functional group and a constitutional unit having a hydroxyl group, wherein an isocyanate compound containing a radical polymerizable group is amide-bonded with at least a part of said acid functional group via an isocyanate group of the isocyanate compound and/or urethane-bonded with at least a part of said hydroxyl group via the isocyanate group of the isocyanate compound, and the feed amount of said isocyanate compound containing the radical polymerizable group is 1.0 or more in terms of the equivalent ratio of said isocyanate group to said hydroxyl group in the principal chain (NCO/OH).

Side chains of the radical polymerizable groups can be introduced into the photo-curable resin at a high rate by controlling the feed amount of an isocyanate compound containing the radical polymerizable group so that the equivalent ratio (NCO/OH) is 1.0 or more. As a result, the sensitivity of the photo-curable resin can be improved. Further, in the high photo-sensitivity curable resin of the present invention, because the content of a constitutional unit having an acid functional group can be controlled at a proper rate, the alkali-solubility (developing property) can be controlled freely.

The content rate of the constitutional unit having the hydroxyl group is preferable to be kept at 14 mol % or more in the feed amount, as well as controlling the above-mentioned equivalent ratio of the isocyanate group (NCO/OH) to be 1.0 or more. Because the introduction rate of the isocyanate group is raised by controlling the above-mentioned equivalent ratio of the isocyanate group (NCO/OH) to be 1.0 or more, and at the same time, the reacting part of the isocyanate group is increased by making the feed amount of the constitutional unit having the hydroxyl group to be 14 mol % or more, it becomes possible to introduce the side chains of the radical polymerizable group into the photo-curable polymer in very large quantities, resulting in the gain of especially high sensitivity.

The upper limit of the feed amount of the isocyanate compound containing radical polymerizable groups is preferable to be controlled so that the above-mentioned equivalent ratio of the isocyanate groups (NCO/OH) is 2.0 or less. When the above-mentioned equivalent ratio (NCO/OH) is more than 2.0, a lot of unreacted isocyanate compounds are remained in the obtained photo-curable resin, resulting in lowering physical properties of the photo-curable resin.

Normally, unreacted isocyanate compounds remain in the photo-curable resin of the present invention. The amount of the isocyanate compound containing the radical polymerizable group which is actually introduced as side chains into a photo-curable polymer, an essential component of a photo-curable resin, can be measured with $^1$H-NMR. After removing components of 5000 or less in weight-average molecular weight in terms of polystyrene from the photo-curable resin of the present invention by a method of reprecipitation refining and the like, when an amount of the double bonds of the isocyanate compound containing the radical polymerizable group which is introduced into a high molecular weight fractionation of a photo-curable polymer is measured with $^1$H-NMR, the amount of the residue of the isocyanate compound containing the radical polymerable group to 100 mol of constitutional units of the principal chain reaches to 8 mol or more.

The production method of the high photo-sensitivity curable resin in the present invention is characterized by reacting an isocyanate compound containing the radical polymerizable group with a raw material polymer having a principal chain comprising at least a constitutional unit having an acid functional group and a constitutional unit having a hydroxyl group at the rate of 1.0 or more in terms of the equivalent ratio of the isocyanate group to the hydroxyl group in the principal chain (NCO/OH).

In one aspect of said production method, the isocyanate compound containing the radical polymerizable group is dropped into a solution made by dissolving or dispersing the raw material polymer in a solvent and is reacted. When an isocyanate compound containing the radical polymerizable group is dropped little by little into a solution of the raw material polymer (namely a dropping method), a high photo-sensitivity curable resin is easily obtained even in a condition that the feed amount of an isocyanate compound is relatively small that is, the equivalent ratio of the isocyanate group to the hydroxyl groups (NCO/OH) is near 1.0.

In the present invention, after a high photo-sensitivity curable resin is synthesized by reacting the isocyanate compound containing the radical polymerizable group with a raw material polymer having a principal chain comprising at least a constitutional unit having an acid functional group and a constitutional unit having a hydroxyl group, the stability of the high photo-sensitivity curable resin can be improved by reacting it further with an alcohol. It is presumed that the high photo-sensitivity curable resin treated with an alcohol has a molecular structure in which alcohols are bonded to at least part of acid functional groups in the principal chain of the high sensitivity resin via the hydroxyl groups of the alcohol. When a high sensitivity resin is treated with alcohol, since increase in viscosity becomes hard to be caused, the shelf life is improved, in addition, since it becomes easy to control coating, coating unevenness is hardly caused.

In the present invention, when the raw material polymer for a photo-curable resin, that is, the principal chain part of the photo-curable polymer is formed, it is preferable to carry out the polymerization reaction by using an azo polymerization initiator of non-nitryle series or a polymerization initiator of peroxide series as a polymerization initiator. Moreover, when the isocyanate compound containing the radical polymerizable group is reacted with the raw material a polymer, it is preferable to use a compound selected from the group of compounds of phenol series shown in the following formula (9) and compounds of phosphite series shown in the following formula (15) as a polymerization inhibitor. In cases where the high photo-sensitivity curable resin is formed by using the above-mentioned specific polymerization initiator and/or the above-mentioned specific polymerization inhibitor, the obtained liquid after the reaction shows a high light transmittance in the range of visible and ultraviolet light. Consequently, even if the reaction liquid containing the high photo-sensitivity curable resin is used without purifying as a coating liquid as it is, it is possible to form a film excellent in transparency because the liquid has a small quantity of coloring components. Further, the film is also excellent in exposure sensitivity because the reaction liquid has a high light transmittance in the range of ultraviolet light:

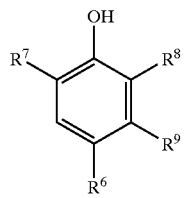

Formula (9)

wherein $R^6$ is hydrogen, an alkyl group having 1 to 5 carbon atoms, or the following formula (10):

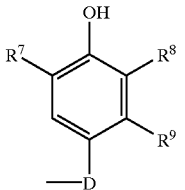

Formula (10)

wherein D is —S—, an alkylene group having 1 to 10 carbon atoms or an alkylidene group having 1 to 10 carbon atoms. $R^7$ is hydrogen or an alkyl group having 1 to 10 carbon atoms. $R^8$ is hydrogen, an alkyl group having 1 to 10 carbon atoms or the following formula (11):

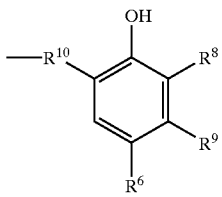

Formula (11)

Here, $R^{10}$ in the formula (11) is an alkylene group having 1 to 10 carbon atoms or an alkylidene group having 1 to 10 carbon atoms, $R^9$ is hydrogen or an alkyl group having 1 to 10 carbon atoms. However, at least one of $R^7$ and $R^8$ is a tertiary butyl group or an alkyl group having a cyclohexyl group. And substituents indicated with the same code may be the same one or different each other.

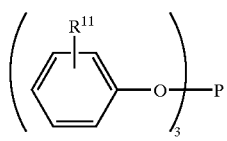

Formula (15)

wherein $R^{11}$ is hydrogen or an alkyl group having 1 to 20 carbon atoms.

By using the above-mentioned specific polymerization initiator and/or the above-mentioned specific polymerization inhibitor, an improved light transmittance can be provided. For example, when a solution of the high photo-sensitivity curable resin in a 3-methoxybutyl acetate of 20 wt. % as resinous solid content is prepared by diluting the reaction liquid containing the high photo-sensitivity curable resin as it is with 3-methoxybutyl acetate, or dissolving the high photo-sensitivity curable resin isolated from the reaction liquid in 3-methoxybutyl acetate, and then this prepared solution is put into a quartz cell of 1 cm square, the light transmittance shows 60% or more at 400 nm in the range of visible light or 50% or more at 360 nm in the range of ultraviolet light.

The photo-curable resin composition to be provided in the present invention is characterized by containing the above-mentioned high photo-sensitivity curable resin as an essential component. The photo-curable resin composition of the present invention succeeds wholly the excellent properties of the high photo-sensitivity curable resin as an essential component. That is, the productivity of film formation is high because the composition can be hardened in a short time at a small exposure amount. Furthermore, since increase in viscosity becomes hard to be caused by treating the high photo-sensitivity curable resin with alcohol, the composition are excellent in shelf life and coating controlability. As a result, coating films with uniform thickness and patterns with accurate size and shape can be obtained. In addition, the composition is also excellent in transparency, and it is possible to form a film which is required transparency.

According to the present invention, it is possible to obtain a photo-curable resin composition having an excellent sensitivity.

That is, a minimum exposure amount of said photo-curable resin composition can be made to be 100 mJ/cm$^2$ or less when said photo-curable resin composition is applied on a base plate and pre-baked to form a coated film, the coated film is exposed and the film thickness is measured (the film thickness before development), then the exposed coated film is developed and the film thickness is measured again after post-baking (the final film thickness after hardening), and the residual film rate is measured according to the following equation, Residual film rate (%)=(final film thickness after hardening (μm)÷film thickness before development (μm))×100, on the other hand, the same photo-curable resin composition is applied on a base plate in the same conditions as those for measuring the residual film rate, the film thickness is measured after the coated film is pre-baked and completely hardened by exposing (the completely exposed film thickness), then the exposed coated film is post-baked with no developing process in the same conditions as those for measuring the residual film rate, and the film thickness is measured again (the final film thickness without the developing process), and the reference residual film rate is measured according to the following equation, Reference residual film rate (%)=(final film thickness without the developing process (μm)÷completely exposed film thickness (μm))×100, thus minimum exposure amount is defined as the smallest exposure amount making he calculated residual film rate equal to the reference residual film rate, provided that the error limit is 1%.

The photo-curable resin composition of the present invention, which is obtained like this, is suitable to form a color layer of a color filter, a protection film coating the color layer, and column-shaped spacers to maintain a cell gap in a liquid crystal display panel. It is possible to precisely form the color layer and the protection film of desired thickness, and the column-shaped spacers of desired height.

DETAILED DESCRIPTION OF THE PREFERRED EMBODIMENTS

High Photo-sensitivity Curable Resin

Figure 1:
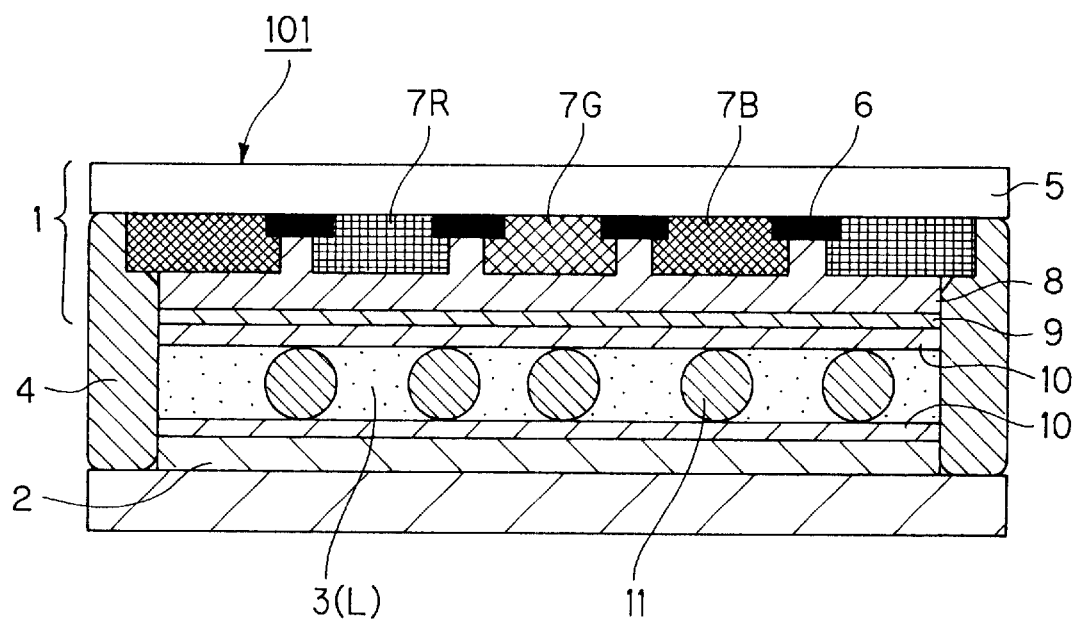
FIG. 1 is a schematic cross-sectional view of an embodiment of a liquid crystal display panel.
Figure 2:
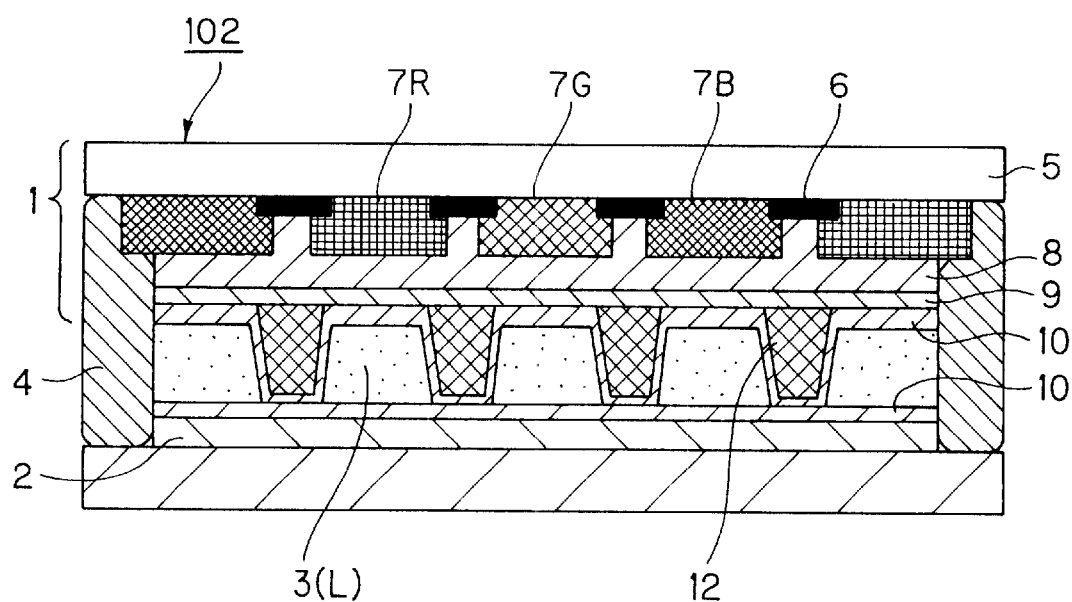
FIG. 2 is a schematic cross-sectional view of another embodiment of a liquid crystal display panel.

A high photo-sensitivity curable resin provided by the present invention comprises a photo-curable polymer which has a principal chain containing at least a constitutional unit having an acid functional group and a constitutional unit having a hydroxyl group, and the principal chain is provided with side chains derived from isocyanate compounds each containing a radical polymerizable group, wherein a part of isocyanate compounds are amide-bonded with at least a part of the acid functional groups via the isocyanate groups of the isocyanate compounds and/or the other part of isocyanate compounds are urethane-bonded with at least a part of the hydroxyl groups via the isocyanate groups of the isocyanate compounds. Further, unreacted acid functional groups and unreacted hydroxyl groups are remaining in the principal chain of the high photo-sensitivity curable resin.

The constitutional unit having an acid functional group is a component contributing to alkali developing property, and its content rate is controlled depending on the degree of alkali-solubility required for the photo-curable resin. As a monomer used to introduce a constitutional unit having an acid functional group into the principal chain of a polymer, a compound having a double bond containing group and an acid functional group can be used. The double bond is normally ethylenical double bond The acid functional group is normally carboxylic group, but any group other than carboxylic group is also acceptable if the component can contribute to alkali developing property.

As a constitutional unit having an acid functional group, a constitutional unit shown in the following formula (1) is preferable:

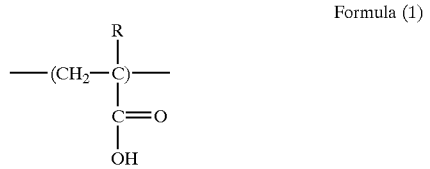

Formula (1)

wherein R is hydrogen or an alkyl group having 1 to 5 carbon atoms.

R contained in the formula (1) and in other formulas mentioned later is hydrogen or an alkyl group having 1 to 5 carbon atoms. As alkyl groups, methyl group, ethyl group, n-propyl group, isopropyl group, n-butyl group, isobutyl group, sec-butyl group, tert-butyl group, n-pentyl group and the like are exemplified. As monomers used to introduce the constitutional unit shown in formula (1), acrylic acid, methacrylic acid, 2-carboxy-1-butene, 2-carboxy-1-pentene, 2-carboxy-1-hexene, 2-carboxy-1-heptene and the like are exemplified.

The constitutional unit having a hydroxyl group is basically a component in which a radical polymerizable group is introduced. That is, part of an isocyanate compound containing the radical polymerizable group, which is added in the reaction zone, reacts with acid functional groups in the principal chain to form side chains of radical polymerizable groups, but most part of the isocyanate compound reacts with hydroxyl groups in the principal chain to form side chains of radical polymerizable groups. Accordingly, the content rate of the constitutional unlit having a hydroxyl group is controlled depending on the degree of photopolymerization property which is required for photo curable resins. As a monomer used to introduce a constitutional unit having a hydroxyl group into the principal chain of a polymer, a compound having a double bond containing group and a hydroxyl group can be used.

As a constitutional unit having a hydroxyl group, constitutional unit shown in the following formula (2) is preferable:

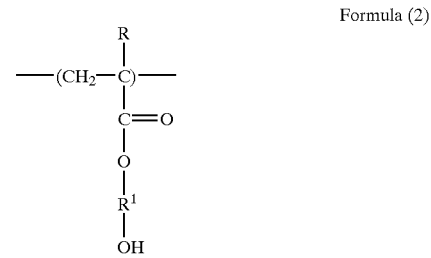

Formula (2)

wherein R is the same group as mentioned above, and $R^1$ is an alkylene group having 2 to 4 carbon atoms.

$R^1$ contained in formula (2) is an alkylene group having 2 to 4 carbon atoms, for example, ethylene group, propylene group, butylene group and the like can be exemplified. As monomers used to introduce the constitutional unit shown in formula (2), 2-hydroxyethyl acrylate, 2-hydroxyethyl methacrylate, 2-hydroxypropyl acrylate, 2-hydroxypropyl methacrylate, 4-hydroxybutyl acrylate, 4-hydroxybutyl methacrylate and the like are illustrated.

The principal chain of a photo-curable polymer contains a constitutional unit having an acid functional group as shown in formula (1) and a constitutional unit having a hydroxyl group as shown in formula (2) as essential copolymer components, but may contain other copolymer components. For example, a constitutional unit having an aromatic carbon ring and/or a constitutional unit having an ester group may be contained in the principal chain.

The constitutional unit having an aromatic carbon ring is a component giving film forming property to a photo-curable resin when the photo-curable resin is used to form a film as a protection film of a color filter and the like. As monomers used to introduce a constitutional unit having an aromatic carbon ring into the principal chain of a polymer, a compound having a double bond containing group and an aromatic carbon ring can be used.

As a constitutional unit having an aromatic carbon ring, a constitutional unit shown in the following formula (3) are preferable:

Formula (3)

wherein R is the same group as mentioned above, and $R^2$ is an aromatic carbon ring.

$R^2$ contained in formula (3) is an aromatic carbon ring, for example, phenyl group, naphthyl group and the like are illustrated. As monomers used to introduce the constitutional unit shown in formula (3), for example, styrene, α-methyl styrene can be exemplified. And, halogen atoms such as chlorine and bromine, alkyl groups such as methyl group and ethyl group, amino groups such as amino group and dialkyl amino group, cyano groups, carboxyl groups, sulfonic acid groups, phosphoric acid groups and the like may be substituted for the aromatic ring.

The constitutional unit having an ester group is a component retarding the alkali developing property of a photo-curable resin. As monomers used to introduce a constitutional unit having an ester group into the principal chain of a polymer, a compound having a double bond containing group and an ester group can be used.

As a constitutional unit having an ester group, a constitutional unit shown in the following formula (4) is preferable:

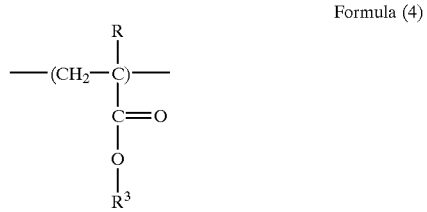

Formula (4)

wherein R is the same group as mentioned above, and $R^3$ is an alkyl group or an aralkyl group.

$R^3$ contained in formula (4) is an alkyl group or an aralkyl group, for example, an alkyl groups having 1 to 12 carbon atoms, aralkyl groups such as benzyl group and phenylethyl group, and the like are exemplified. As monomers used to introduce a constitutional unit shown in formula (4), for example, esters of (meth)acrylic acid such as methyl (meth)acrylate, ethyl (meth)acrylate, butyl (meth)acrylate, 2-ethyhexyl (meth)acrylate, phenyl (meth)acrylate, cyclohexyl (meth)acrylate, dicyclopentanyl (meth)acrylate, dicyclopentanyl oxyethyl (meth)acrylate, isobonyl (meth)acrylate, benzyl (meth)acrylate, and phenylethyl (meth)acrylate, are exemplified.

The monomers used for introducing the component units represented by the formulae (1) to (4) can be used alone or as a mixture of two or more per each component unit.

In the principal chains composed of each constitutional unit mentioned above, isocyanate compounds each of which contains a radical polymerizable group are reacted with at least part of the acid functional groups to form amide-bonds via the isocyanate groups in the isocyanate compounds and/or reacted with at least part of the hydroxyl groups to form urethane-bonds, and side chains of radical polymerizable groups are formed as a result.

As the isocyanate compound containing the radical polymerizable group, (meth)acryloyloxyalkyl isocyanate shown in the following formula (5) can be used. Now, (meth)acryl in the present invention means either of an acryl group or a methacryl group, (meth)acryloyl means either of an acryloyl group or a methacryloyl group:

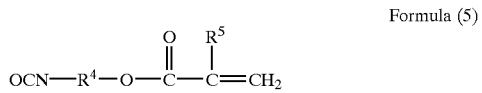

Formula (5)

wherein $R^4$ is an alkylene group, and $R^5$ is hydrogen or methyl.

Among (meth)acryloyloxyalkyl isocyanates shown in formula (5), it is preferable to use one in which a (meth)acryloyloxy group is bonded to an isocyanate group (—NCO) via an alkylene group having 2 to 6 carbon atoms. Concrete examples include 2-acryloyloxyethyl isocyanate, 2-methacryloyloxyethyl isocyanate and the like. 2-methacryloyloxyethyl isocyanate is commercially available, for example, trade names of "Karenzu MOI" made by Showa Denko Co. and the like.

In the photo-curable resin of the present invention, the content of each constitutional unit in the principal chain, if it is expressed by the feed amount of each unit in cases where the whole quantity is composed of the total amount used (the total feed amount) of a monomer to form the principal chain and the isocyanate compound containing the radical polymerizable group, is as follows:

First, the content rate of a constitutional unit having an acid functional group as shown in formula (1) is controlled so as to satisfy the degree of alkali-solubility required as mentioned above, and it is generally from 5 mol % to 55 mol %, preferably from 10 mol % to 30 mol % in terms of the feed amount.

The content rate of a constitutional unit having a hydroxyl group as shown in formula (2) is controlled so as to satisfy the required degree of photopolymerization property (i.e., sensitivity), and it is normally from 5 mol % to 95 mol %, preferably from 14 mol % to 50 mol % in terms of the feed amount. Because a constitutional unit having a hydroxyl group is a main part of introducing a radical polymerizable group, in cases where the amount of this constitutional unit is too small, even if the introduction rate of radical polymerizable groups to the amount of hydroxyl groups is high, the content rate of radical polymerizable groups in the whole photo-curable resin becomes low, and high sensitivity can not be obtained. On the other hand, in cases where the amount of a constitutional unit having a hydroxyl group is too large, the synthesis of a photo-curable resin becomes difficult because it becomes hard to be dissolved into an organic solvent.

The content rate of a constitutional unit having an aromatic carbon ring as shown in formula (3) is controlled in order to adjust film coating property, and it is normally from 0 mol % to 75 mol %, preferably from 5 mol % to 50 mol % in terms of the feed amount.

The content rate of a constitutional unit having an ester group as shown in formula (4) is controlled in order to suppress alkali developing property as necessary, and it is normally from 0 mol % to 75 mol %, preferably from 5 mol % to 50 mol % in terms of the feed amount.

In the present invention, the feed amount of the isocyanate compound having the radical polymerizable group is particularly important to improve the sensitivity of the photo-curable resin. In the present invention, the feed amount of the isocyanate compound containing the radical polymerizable group is controlled to be 1.0 or more (that is, equivalent or more) in terms of the equivalent ratio of the isocyanate groups of the isocyanate compounds to the hydroxyl groups in the principal chain of a photo-curable polymer (NCO/OH). To be concrete, while the amount of hydroxyl groups is calculated from the feed amount of a constitutional unit having a hydroxyl group as shown in formula (2), the amount of isocyanate groups is calculated from the feed amount of the isocyanate compound containing the radical polymerizable group. Then these calculated values lead to the above-mentioned equivalent ratio (NCO/OH). It becomes possible to introduce side chains having radical polymerizable groups at high ratio and to improve the sensitivity of a photo-curable resin as a result by making this equivalent ratio (NCO/OH) to be 1.0 or more, preferably 1.2 or more.

Furthermore, it is preferable that while the above-mentioned equivalent ratio of isocyanate groups (NCO/OH) is controlled to be 1.0 or more, the content rate of the constitutional unit as shown in formula (2) is to be 14 mol % or more as the feed amount. Because the introduction rate of isocyanate groups is increased by controlling the above-mentioned equivalent ratio of isocyanate groups (NCO/OH) to be 1.0 or more, at the same time, the part with which isocyanate groups react is increased by making the feed amount of a constitutional unit having a hydroxyl group to be 14 mol % or more, it becomes possible to introduce very large amount of side chains of radical polymerizable groups into a photo-curable polymer, and particularly high sensitivity of the polymer can be obtained.

It is preferable that the upper limit of the feed amount of an isocyanate compound containing the radical polymerizable group is controlled so as to be 2.0 or less in terms of the above-mentioned equivalent ratio of isocyanate groups (NCO/OH). In cases where the above mentioned equivalent ratio (HCO/OH) exceeds 2.0, unreacted isocyanate compounds which are not introduced into the principal chain will remain in the photo-curable resin, resulting in lowering physical properties of the film coated by using such a photo-curable resin. In cases where alcohol treatment to be mentioned later is carried out to prevent increase in viscosity of the photo-curable resin, isocyanate groups of the unreacted isocyanate compound containing the radical polymerizable groups remaining in the photo-curable resin will, react with alcohol to disappear, but also in that case, the part of the radical polymerizable groups of the unreacted isocyanate compound will remain. As a result, a large amount monofunctional monomers will remain in the photo-curable resin, resulting in lowering the sensitivity of the photo-curable resin.

A photo-curable resin comprising the above-mentioned photo-curable polymer can be produced by, first, producing a polymer (a raw material polymer) having a principal chain which comprises at least a constitutional unit having an acid functional group as shown in formula (1) and a constitutional unit having a hydroxyl group as shown in formula (2), and which if necessary, has a constitutional unit having an aromatic carbon ring as shown in formula (3), a constitutional unit having an ester group as shown in formula (4), or other constitutional units, and then, reacting the raw material polymer with an isocyanate compound containing a radical polymerizable group.

As a solvent for polymerization used to produce a raw material polymer, a solvent which does not have an active hydrogen such as one contained in a hydroxyl group and an amino group, is preferable. For example, ethers such as tetrahydrofuran, glycol ethers such as diethylene glycol dimethy ether, diethylene glycol diethyl ether, and diethylene glycol methyl ethyl ether, cellosolve esters such as methyl cellosolve acetate, propylene glycol monomethyl ether acetate, 3-methoxybutyl acetate and the like are given. Aromatic hydrocarbons, ketones, esters and the like can also be used.

As a polymerization initiator used to produce a raw material polymer, initiators generally known as a radical polymerization initiator can be used. As the concrete examples, azo compounds of nitryl series (azo polymerization initiators of nitryl series) such as 2,2'-azobisisobutyronitryl, 2,2'-azobis-(2,4-dimethylvaleronitryl), and 2,2'-azobis-(4-methoxy-2,4-dimethyvaleronitryl); azo compounds of non-nitryl series (azo polymerization initiators of non-nitryl series) such as dimethyl-2,2'-azobis-(2-methylpropionate), and 2,2'-azobis-(2,4,4-trimethylpentane); organic peroxides (peroxide polymerization initiators) such as t-hexylperoxy pivalate, tert-butylperoxy pivalate, 3,5,5-trimethylhexanoyl peroxide, octanoyl peroxide, lauroyl peroxide, stearoyl peroxide, 1,1, 3,3-tetramethylbutylperoxy-2-ethyl hexanoate, succinic peroxide, 2,5-dimethyl-2,5-di(2-ethylhexanoylperoxy) hexane, 1-cyclohexyl-1-methylethylperoxy 2-ethyl hexanoate, t-hexylperoxy 2-ethyl hexanoate, 4-methylbenzoyl peroxide, and benzoyl peroxide, 1,1-bis-(tert-butylperoxy) cyclohexane; and hydrogen peroxide are given. When a peroxide is used as a radical polymerization initiator, it is also acceptable to use it in combination with a reducing agent as a redox type polymerization initiator.

In the production of a raw material polymer, a molecular weight controlling agent can be used to control the weight-average molecular weight of the polymer. For example, halogenated hydrocarbons such as chloroform and carbon tetrabromide; mercaptans such as n-hexyl mercaptan, n-octyl mercaptan, n-dodecyl mercaptans, tert-dodecyl mercaptan and thioglycolic acid; xanthogens such as dimethyl xanthogen sulfide, and diisopropyl xanthogen sulfide; turpinolene, α-methyl styrene dimmer, and the like are given.

The raw material polymer may be either a random copolymer or a block copolymer.

In the case of producing a random copolymer, polymerization can be carried out by dropping a composition containing each monomer illustrated in the above-mentioned formulas (1) to (4) and a catalyst into a polymerization vessel containing a solvent at a 80 to 110° C. over 2 to 5 hours, and maturation.

It is preferable that the polystyrene-based weight average molecular weight (hereinafter referred to simply as the "weight average molecular weight" or "Mw") of the raw material polymer having the component units represented by the formulae (1) to (4) is in the range from 10,000 to 1,000,000, the acidic value is 5 to 400 mg KOH/g, and the hydroxyl group value is 5 to 400 mg KOH/g.

The reaction of a raw material polymer and the isocyanate compound containing the radical polymerizable group can be carried out in such manner that the whole quantity of the isocyanate compounding the radical polymerizable group is dropped at one time into a solution of the raw material polymer under the presence of a small amount of a catalyst and then their reaction is continued for a certain time, or the isocyanate compound is dropped little by little. As a catalyst, dibutyl tin laurate and others are given, and a polymerization inhibitor such as p-methoxy phenol, hydroquinone, naphthylamine, tert-butyl catechol and 2,3-di-tert-butyl p-crezol, is used as needed.

In the reaction, in cases where the isocyanate compound containing the radical polymerizable group is dropped little by little into a solution of the raw material polymer (i.e., a dropping method), a high photo-sensitivity curable resin can be easily obtained even in the condition that the feed amount of the isocyanate compound is relatively small, that is, the equivalent ratio of is ocyanate groups to hydroxyl groups (NCO/OH) is in the vicinity of 1.0. The reason is presumed that when isocyanate groups always exist only a little in the reaction zone, the isocyanate groups react preferentially with hydroxyl groups and useless side reactions hardly occur.

On the other hand, in cases where the whole quantity of the isocyanate compound containing the radical polymerizable group is dropped at one time into a solution of the raw material polymer and then their reaction is continued for a certain time (i.e., a lump injection method), a high photo-sensitivity curable resin can be easily obtained when the feed amount of the isocyanate compound is a little more than that in the case of the dropping method. Therefore, in case of the lump injection method, it is preferable that the feed amount of the isocyanate compound containing the radical polymerizable group is controlled to be 1.2 or more in terms of the equivalent ratio of isocyanate groups to hydroxyl groups contained in the principal chain of a photo-curable polymer (NCO/O).

The isocyanate compound containing the radical polymerizable group will react with an acid functional group in a raw material polymer to make an amide-bond via the isocyanate group. For example, the part of the isocyanate compound will release carbon dioxide gas and bind to a constitutional unit shown in formula (1) by amide-bonding to form a constitutional unfit as shown in the following formula (6).

On the other hand, an isocyanate compound containing the radical polymerizable group will react with a hydroxyl group in a raw material polymer to make an urethane-bond via the isocyanate group. For example, it will additively react and bind to a constitutional unit shown in formula (2) by urethane-bonding to form a constitutional unit as shown in the following formula (7).

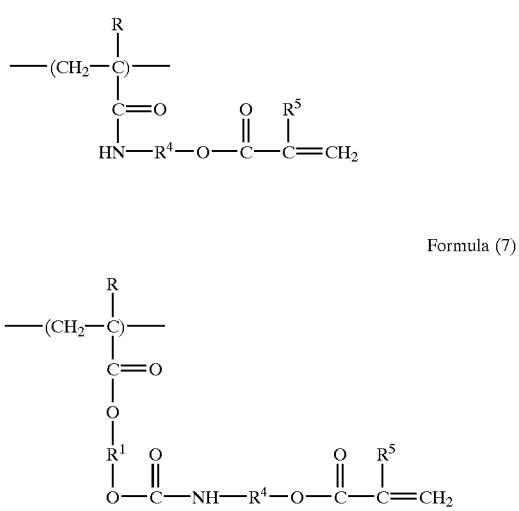

Formula (6)

Formula (7)

The photo-curable polymer in the photo-curable resin obtained like this has a molecular structure where a constitutional unit having an acid functional group as shown in formula (1), a constitutional unit having a hydroxyl group as shown in formula (2), a constitutional unit as shown in formula (6) in which a radical polymerizable group is introduced into a constitutional unit having an acid functional group, and a constitutional unit as shown in formula (7) in which a radical polymerizable group is introduced into a constitutional unit having a hydroxyl group shown in formula (2) are interlocked in a random order.

The reaction of an isocyanate compound containing the radical polymerizable group with a hydroxyl group has nearly 20 times reaction speed compared with the reaction of the isocyanate compound with an acid functional group, especially carboxyl group. For that reason, the radical polymerizable group is mainly introduced into a constitutional unit having a hydroxyl group. Further, in a constitutional unit having an acid functional group, even if a radical polymerizable group is introduced into the part of the acid functional group, most of acid functional groups remain.

In the case this photo-curable resin is used for forming a color layer of a color filter, a protection film for covering the color layer, or a column-shaped spacer for maintaining the cell gap of a liquid crystal display panel, it is preferable that the weight average molecular weight, which is measured with GPC (gel permeation chromatography), is adjusted in the range from 10,000 to 1,000,000, preferably from 20,000 to 100,000. With a weight average molecular weight less than 10,000, the developing property is so good that the pattern shape at the time of pattern exposure can hardly be controlled, or even in the case a pattern can be produced, a problem of reduction of the final film thickness (film reduction) is involved. In contrast, with a weight average molecular weight more than 1,000,000, the viscosity at the time of providing a resist is so high that the coating suitability is deteriorated, and a problem of the developing property deterioration to hinder the pattern formation is involved.

The acidic value of the curable resin is 5 to 400 mg KOH/g, preferably 10 to 200 mg KOH/g. The acidic value is related with the alkaline developing property, and thus if the acidic value is too low, a problem of a poor developing property, or a poor adhesion property onto the substrate and a resin of the color filter is involved. In contrast, if the acidic value is too high, the developing property is so good that a problem of control difficulty of the pattern shape at the time of pattern exposure is involved. The hydroxyl group value in the photo-curable resin can be adjusted in the range from 0 to 200 mg KOH/g. It is not always necessary to keep the hydroxyl group in the principal chain of the photo-curable resin, but in the case it is kept, it is effective for adjusting the solubility with respect to a solvent.

Among high photo-sensitivity curable resins obtained according to the present invention, those described below are particularly preferable to form the color layer of a color filter, the protection film coating the color layer or the column-shaped spacer for keeping the cell gap of a liquid crystal display panel. That is, on the basis of the whole quantity of each constitutional unit constituting the principal chain and side chains of a photo-curable resin, those are preferable in which the feed amount of the constitutional unit having the acid functional group is from 10 to 30 mol %, that of the constitutional unit having the hydroxyl group is 14 mol % or more, and that of the isocyanate compound containing the radical polymerizable group is 14 mol % or more, and furthermore, the acid value is from 80 to 140 mg KOH/g and the weight-average molecular weight is from 10,000 to 100,000 in terms of polystyrene. However, also in this case, the feed amount of the isocyanate compound containing the radical polymerizable group is controlled to be 1.0 or more, preferably 1.2 or more in terms of the equivalent ratio of isocyanate groups to hydroxyl groups in the principal chain (NCO/OH). Moreover, it is preferable that the principal chain of the photo-curable resin is composed of constitutional units shown in the above-mentioned formula (1), formula (2), formula (3), and formula (4).

Among the above-mentioned photo-curable resins taken as examples, on the basils of the whole quantity of each constitutional unit constituting the principal chain and side chains of the high photosensitivity curable resin, those are more preferable in which the feed amount of the constitutional unit having the acid functional group is from 10 to 30 mol %, that of the constitutional unit having the hydroxyl group is from 15 to 19 mol %, and that of the isocyanate compound containing radical polymerizable group is from 18 to 26 mol %, and furthermore, the acid value is from 90 to 120 mg KOH/g and the weight-average molecular weight is from 30,000 to 60,000 in terms of polystyrene.

In the high photo-sensitivity curable resin obtained according to the present invention, normally, an unreacted isocyanate compound containing the radical polymerizable group which is not introduced into the principal chain is concomitant. The amount of an isocyanate compound containing the radical polymerizable group, which is actually introduced as a side chain into the photo-curable polymer, an essential component, of the photo-curable resin can be measured with $^1$H-NMR.

After removing components of 5000 or less in the weight-average molecular, weight in terms of polystyrene from a photo-curable resin obtained according to the present invention by a suitable method of reprecipitation refining and others, if the double bonds of the isocyanate compound containing the radical polymerizable group that is introduced into a photo-curable polymer of high molecular weight fractionation are measured with $^1$H-NMR, the amount of the residue of the introduced isocyanate compound to 100 mol of constitutional units of the principal chain reaches to 8 mol or more, and 12 mol % or more in an especially high photo-sensitivity curable resin.

In order to carry out the reprecipitaion refining, for example, a solution of a high photo-sensitivity curable resin (the solid content: about 25 wt. %, the solvent: 3-methoxybutyl acetate) is diluted with tetrahydrofuran, then the diluted solution is dropped into isopropyl alcohol, hexane, or a mixed solvent of both (isopropyl alcohol:hexane (weight ratio)=100:0 to 0:100) and deposited solids are recovered. A reaction liquid obtained, by reacting an isocyanate compound containing the radical polymerizable group with a raw material polymer may be diluted with tetrahydrofuran, and the diluted liquid may be used in the reprecipitation process. Moreover, the deposited solid may be dissolved again in 3-methoxybutyl acetate and then diluted by tetrahydrofuran, and the obtained diluted liquid may be dropped into an individual or mixed solvent of isopropyl alcohol and/or hexane in the same or different ratio as the last time and deposited solids may be recovered. As described above, components of 5000 or less in the weight-average molecular weight can be removed from the photo-curable resin by carrying out the reprecipitating process or repeating the process several times if necessary.

Moreover, in the case where a color layer of a color filter or a protection film for covering the color layer is formed, using the high photo-sensitivity curable resin of the present invention, a high transparency with respect to the curable resin is required. In the case where a highly transparent photo-curable resin is needed, it is preferable to carry out the polymerization reaction, using a non-nitrile-based azo polymerization initiator or a peroxide-based polymerization initiator at the time of forming a raw material polymer, that is, the principal chain part of the photo-curable resin by reacting a monomer having the double bond containing group and the acid functional group, and a monomer having the double bond containing group and the hydroxyl group, and optionally another monomer as needed. As the non-nitrile-based azo or peroxide-based polymerization initiator, the above-mentioned examples can be used.

Furthermore, the transparency of the photo-curable resin can also be improved by using a specific phenol-based compound or a specific phosphite-based compound as a polymerization inhibitor at the time of reacting the raw material polymer with the radical polymerizlable group-containing isocyanate compound.

That is, specific phenolic polymerization inhibitors, which can improve the transparency of a photo-curable resin, can be shown in the following formula (9):

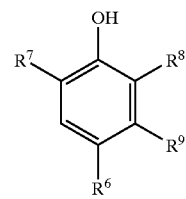

Formula (9)

wherein $R^6$ is hydrogen, an alkyl group having 1 to 5 carbon atoms, or the following formula (10):

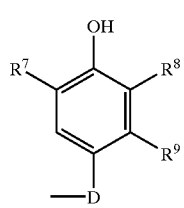

Formula (10)

wherein D is —S—, an alkylene group having 1 to 10 carbon atoms, or an alkylidene group having 1 to 10 carbon atoms, $R^7$ is hydrogen or an alkyl group having 1 to 10 carbon atoms, and $R^8$ is hydrogen, an alkyl group having 1 to 10 carbon atoms, or the following formula (11):

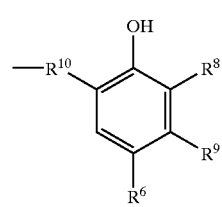

Formula (11)

wherein $R^{10}$ is an alkylene group having 1 to 10 carbon atoms or an alkylidene group having 1 to 10 carbon atoms. $R^9$ is hydrogen or an alkyl group having 1 to 10 carbon atoms. However, at least one of $R^7$ and $R^8$ is a tertiary butyl group or an alkyl group having a cyclohexyl group, and substituents indicated with the same code may be the same one or different each other.

Among phenolic compounds shown in the above-mentioned formula (9), those shown in the following formulas (12), (13), or (14) are preferable:

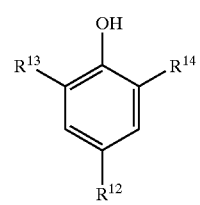

Formula (12)

wherein $R^{12}$ is hydrogen or an alkyl group having 1 to 5 carbon atoms, $R^{13}$ and $R^{14}$ is hydrogen or an alkyl group having 1 to 10 carbon atoms. However, at least one of $R^3$ and $R^4$ is a tert-butyl group or an alkyl group having a cyclohexyl group.

As a concrete example corresponding to the above-mentioned formula (12), 3,5-di-tert-butyl-4-hydroxy toluene (BHT) can be cited:

Formula (13)

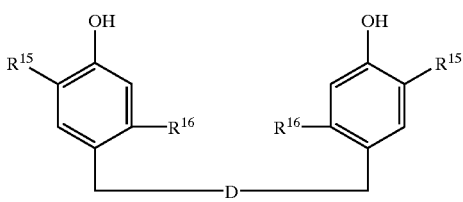

wherein D is —S—, an alkylene group having 1 to 10 carbon atoms or an alkylidene group having 1 to 10 carbon atoms, $R^{15}$ is hydrogen or an alkyl group having 1 to 10 carbon atoms, and $R^{16}$ is hydrogen or an alkyl group having 1 to 10 carbon atoms. However, substituents indicated with the same code may be the same one or different each other, and at least one of $R^{15}$ is a tertiary butyl group or an alkyl group having a cyclohexyl group.

As concrete examples corresponding to the above-mentioned formula (13), 4,4'-thio-bis(3-methyl-6-tert-butylphenol), and 4,4'-butylidene-bis(3-methyl-6-tert-butylphenol) can be cited:

Formula (14)

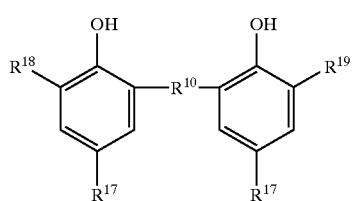

wherein $R^{10}$ is an alkylene group having 1 to 10 carbon atoms or an alkylidene group having 1 to 10 carbon atoms, $R^{17}$ is hydrogen or an alkyl group having 1 to 5 carbon atoms, and $R^{18}$ and $R^{19}$ is hydrogen or an alkyl group having 1 to 10 carbon atoms. However, at least one of $R^{18}$ and $R^{19}$ is a tertiary butyl group or an alkyl group having a cyclohexyl group, and substituents indicated with the same code may be the same one or different each other.

As concrete examples corresponding to the above-mentioned formula (14), 2,2'-methylene-bis(4-methyl-6-tert-butylphenol), 2,2'-methylene-bis(4-ethyl-6-tert-butylphenol), and 2,2'-dihydroxy-3,3'-di(α-methyl-cyclohexyl)-5,5'-dimethyl diphenyl methane can be cited.

Moreover, specific phosphate polymerization inhibitors, which can improve the transparency of a photo-curable resin, can be shown in the following formula (15):

Formula (15)

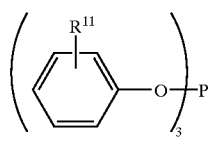

wherein $R^{11}$ is hydrogen or an alkyl group having 1 to 20 carbon atoms.

As a concrete example corresponding to the above-mentioned formula (15), tris(nonylated phenyl)phosphate can be cited.

In particular, by reacting a raw material polymer preliminarily produced using the above-mentioned specific polymerization initiator with a radical polymerizable group-containing isocyanate compound using the above-mentioned specific polymerization inhibitor, the excellent transparency can be obtained.

In the case where the photo-curable resin is synthesized using the above-mentioned specific polymerization initiator and/or the above-mention ed specific polymerization inhibitor, since coloring of the obtained reaction liquid is slight, the refining step for eliminating the coloring component from the photo-curable resin can be simplified or completely eliminated. Therefore, the reaction liquid containing the photo-curable resin as it is without refining can be used as a coating liquid for forming a pattern required to have the transparency, such as a color layer of a color filter or a protection film. For example, the reaction liquid containing the photo-curable resin of the present invention is diluted in a 3-methoxy butyl acetate as it is or the photo-curable resin separated from the reaction liquid is dissolved in a 3-methoxy butyl acetate so as to prepare a 3-methoxy butyl acetate solution of a 20% by weight resin solid component. The prepared solution placed in a 1 cm square quartz cell shows the excellent, transparency of a 60% or more light transmittance at 400 nm, preferably 70% or more.

This kind of photo-curable resin tends to have the light transmittance lower in the vicinity of 480 nm so as to show the local minimum point of the light transmittance. However, the transparent photo-curable resin obtained in the present invention does not show the drop of the light transmittance, and has a 85% or more, preferably 90% or more light transmittance in the vicinity of 480 nm under the above-mentioned measurement condition.

The photo-curable resin obtained in the present invention shows a high light transmittance in the entire area of a visible light. In the measurement under the above-mentioned measurement condition, a 60% or more value is shown in 400 to 700 nm, preferably 70% or more, a 80% or more value is shown in 450 to 700 nm, preferably 85% or more, and a 90% or more value is shown in 500 to 700 nm, preferably 95% or more.

Furthermore, in the case where a photo-curable resin is synthesized, using the above-mentioned specific polymerization initiator and/or the above-mentioned specific polymerization inhibitor, the obtained reaction liquid shows little absorption not only in the visible area but also in the ultraviolet area. Therefore, also in the case of forming a film using the reaction liquid containing the photo-curable resin as it is as the coating liquid, an ultraviolet ray reaches to the deep part of the film, and thus the exposure sensitivity can be improved. For example, the reaction liquid containing the photo-curable resin of the present invention is diluted in a 3-methoxy butyl as it is or the photo-curable resin separated from the reaction liquid is dissolved in a 3-methoxy butyl so as to prepare a 3-methoxy butyl acetate solution of a 20% by weight resin solid component. The prepared solution placed in a 1 cm square quartz cell shows the excellent transparency of a 50% or more light transmittance at 360 nm, preferably 60% or more. Since the wavelength in the vicinity of 360 nm is an effective wavelength of the photo polymerization initiator, in the case where the light transmittance in the vicinity of 360 nm is high, the function of the photo polymerization initiator is promoted so that the exposure sensitivity can further be improved.

Since the photo-curable resin of the present invention has high sensitivity to exposure and its alkali-solubility and coating property can be properly controlled, it can be suitably used as an effective component in a photoresist. Particularly, it is suitable to form the color layer of a color filter, the protection film, or the column-shaped spacer for keeping the cell gap of a liquid crystal display panel.

However, if the photo-curable resin is dissolved or dispersed in a solvent, the molecular amount is increased even in a room temperature so as to rapidly raise the viscosity. If the photo-curable resin mixed with an epoxy resin, an acrylic monomer, or a polymerization initiator is dissolved or dispersed in a solvent for preparing a photo resist, the degree and the rate of thickening is further remarkable.

Initially, the present inventors considered that a radical polymerizable group such as a (meth)acryloyl group existing in the photo-curable resin not only relates to the hardening reaction in exposure but also gives rise to the thickening increase ink storage. However, according to observation of a solution of the above-mentioned photo-curable resin by the 1H-NMR spectrum, it is confirmed that the double bond amount of the (meth)acryloyl group is not reduced even if the viscosity of the solution rises. Therefore, the radical polymerization group is not the cause of the thickening increase.

Then, the above-mentioned solution of the photo-curable resin was observed by the FT-IR spectrum (infrared ray absorption spectrum) so that it is confirmed that a minute peak in the vicinity of 1,800 cm$^{-1}$ vanishes according to the viscosity rise. In consideration of the observation result, the FT-IR spectrum of an acrylic anhydride was observed so that a peak was observed at the same position. Moreover, by reacting acetic acid which has a carboxyl group as well as the acrylic acid with a (meth)acryloyloxy ethyl isocyanate, an acid anhydride was obtained.

From these results, the above-mentioned photo-curable resin is considered to have an acid anhydride group. The acid anhydride group is assumed to be generated as a side product according to dehydration condensation of the acid functional groups in the same molecule as a result of the function of the isocyanate group as a dehydrating agent at the time of producing the photo-curable resin by reaction of a polymer having at least the constitutional unit having the acid functional group as shown in formula (1) and a constitutional unit having hydroxyl group as shown in formula (2) with the radical polymerizable group-containing isocyanate compound. Moreover, by dissolving or dispersing, the curable polymer in a solvent and leaving, the acid anhydride group generated in the molecule of the photo-curable resin is assumed to react with a hydroxyl group of the constitutional unit as shown in formula (2) ontained in another molecule of the photo-curable resin so as to ester-bond and cross-link the molecules in the photo-curable resin, resulting in the molecular weight increase and the viscosity rise.

The thickening phenomenon can be prohibited by the alcohol treatment of the above-mentioned photo-curable resin. For treating the photo-curable resin with an alcohol, the alcohol can be added to a solution with the above-mentioned photo-curable resin dissolved or dispersed in a solvent before viscosity rise of the solution or before completion of viscosity rise of the solution. Moreover, it is also possible to polymerize the monomers in a solvent for synthesis such as MBA (3-methoxy butyl acetate, CH3CH(OCH3)CH2CH2OCOCH3) so as to synthesize a raw material copolymer having at least the constitutional units represented by the formulae (1) and (2), drop a radical polymerizable group-containing isocyanate compound into a solution of the obtained polymer for reaction, and subsequently add an alcohol to the obtained reaction liquid. The reaction condition at the time of addition is not particularly limited, and the alcohol can be added when the reaction liquid is hot or it is at a room temperature, or can be added into the reaction liquid at on time.

In the case where an alcohol is added to the above-mentioned solution of the photo-curable resin when the acid anhydride group is still unreacted, the alcohol is assumed to compete with the hydroxyl group of the constitutional unit represented by the formula (2) for getting the acid anhydride group so as to esterify the acid anhydride group. As a result, the cross-linking reaction among the photo-curable resin molecules is prohibited so that the molecular weight increase and the viscosity rise can be prevented.

It is presumed that a photo-curable resin obtained by such alcohol treatment has a principal chain comprising at least a constitutional unit having the acid functional group and a constitutional unit having the hydroxyl group, and has a molecular structure in which an isocyanate compound is amide-bonded with at least a part of the acid functional group and/or urethane-bonded with at least part of the hydroxyl group via the isocyanate groups in said isocyanate compound, and furthermore, alcohol is ester-bonded with at least a part of said acid functional group via the hydroxyl group in the alcohol.

As an example, the molecular structure of an alcohol treated polymer, which is obtained by adding alcohol into a photo-curable resin having a principal chain comprising constitutional units shown in the above-mentioned formulas of (1), (2), (3), and (4), can be shown in the following formula (8):

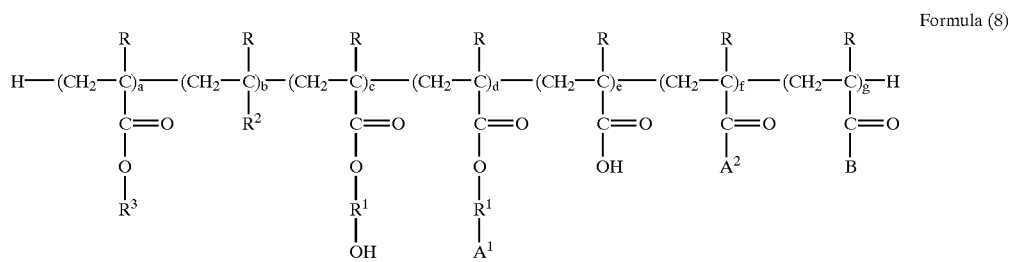

Formula (8)

wherein R, R$^1$, R$^2$, and R$^3$ are the same as mentioned above, A1 indicates a residue after the isocyanate compound containing the radical polymerizable group made an urethane-bond, A$^2$ indicates a residue after the isocyanate compound containing the radical polymerizable group made an amide-bond, and B indicates a residue after the alcohol made an ester-bond, moreover, a, b and c indicate integral numbers of 0 or more, and d, e, f and g indicate integral numbers of 1 or more. Each constitutional unit is allowed to be random copolymerized or block copolymerized.

In the present invention, the reaction with the alcohol should be carried out when a part or the entirety of the acid anhydride groups remains,unreacted in the copolymer resin. For example, since the acid anhydride group is not reacted with the hydroxyl group at all immediately after production of the haedenable resin by reacting a raw material polymer having at least the constitutional unit having the acid functional group as shown by the formulae (1) and the constitutional unit having the hydroxyl group as shown by the formulae (2) with the radical polymerizable group-containing isocyanate compound, and thus the viscosity rise is not started, it can be reacted with the alcohol added from the outside. Moreover, even after leaving the solution of the photo-curable resin at a room temperature for a while, since the unreacted acid anhydride group remains in the case the viscosity rise is still proceeding and not finished completely, the viscosity rise can be prohibited to a certain degree, and thus it is effective.

The kind of the alcohol to be used for prohibiting the thickening phenomenon is not particularly limited, and a compound having an alcoholic hydroxyl group can be used. It can also contain atoms of N, O, S, P, or the like. In general, those having a relatively low molecular weight can easily be handled. For example, those having about 1 to 20 carbon atoms and containing or not containing N, O, S, P, or the like can be presented. More specifically, alcohol-based solvents, such as methanol, ethanol, propanol, butanol, pentanol, hexanol, heptanol, octanol, and decanol; cellosolve-based solvents, such as methoxy alcohol, and ethoxy alcohol; carbitol-based solvents such as methoxy ethoxy ethanol, and ethoxy ethoxy alcohol; ether-based solvents, such as ethylene glycol monomethyl ether, diethylene glycol monomethyl ether, ethylene glycol monopropyl ether, and propylene glycol monomethyl ether; and unsaturated bond-containing solvents, such as 2-hydroxyethyl(meth)acrylate, 2-hydroxypropyl(meth)acrylate, 2-hydroxybutyl(meth) acrylate, 4-pentene-1-ol, tetramethylol methane tri(meth) acrylate, tetratrimethylol propane tri(meth)acrylate, and dipentaerythritol hexaacrylate can be used.

Furthermore, the unreacted alcohol remaining in the solvent of the photo-curable resin can be eliminated as needed by an appropriate means such as the reprecipitation refining. Moreover, it is also possible to add the alcohol to the solution of the photo-curable resin, mix the same as it is with other materials in a solvent (a coating solvent) for providing a coating liquid, and evaporate the same with the coating solvent in the drying step after the coating operation. In the case the residual alcohol is evaporated with another solvent as in this example, it is preferable that the difference in terms of the boiling point of the alcohol and the solvent to be mixed, or the difference in terms of the evaporation rate of the alcohol and the solvent to be mixed is as small as possible, and it is ideal that there is no difference. It is further preferable that the difference in terms of the boiling point of the alcohol and the solvent and the difference in terms of the evaporation rate of the alcohol and the solvent are both small. From this viewpoint, the difference in terms of the boiling point of the alcohol and the solvent to be mixed is preferably within 75° C., particularly preferably within 40° C. Furthermore, the difference in terms of tie evaporation rate of the alcohol and the solvent to be mixed is preferably within 90[n-BuOAc=100], and particularly preferably within 30[n-BuOAc=100]. It is preferable that both boiling point and evaporation rate of the alcohol satisfy the above-mentioned conditions. The evaporation rate (unit: [n-BuOAc=100]) is represented by the relative evaporation rate with the evaporation rate by the weight method of a normal butyl acetate (n-BuOAc) at 25° C. defined as 100.

The amount of the alcohol to be used for prohibiting the thickening phenomenon is adjusted optionally according to the amount of the acid anhydride group contained in the photo-curable resin. The amount is preferably about 10 to 120% by weight with respect to the photo-curable resin.

In order to substantially completely stopping the viscosity rise of the solution of the photo-curable resin, it is necessary to leave the reaction liquid for a certain time after addition of the alcohol for sufficiently reducing the amount of the acid anhydride group, and maturing the alcohol process polymer. The reaction liquid can be left in a room temperature, but the maturation can be completed in a shorter time by heating. It is preferable that the reaction liquid with the alcohol added is matured by leaving at 30 to 170° C. for a period within 72 hours.

For example, if the maturation time at 90° C. is less than 4 hours, the resin cannot be stabilized completely, and thus the thickening prevention effect is insufficient.

Photo-curable Resin Composition

In the case of producing a photo-curable resin composition by using the photo-curable resin of the present invention, a photo polymerizable monomer such as a polyfunctional acrylic-based monomer having two or more functional groups, a polymerization initiator, or the like, can be dissolved and dispersed in a resist solvent (coating solvent for dilution) with a photo-curable resin as the main polymer.

The photo-curable resin composition in the present invention contain contains the photo-curable resin, in general, from 5 to 80 wt. %, preferably from 10 to 50 wt. % by the solid component ratio. With a content of the photo-curable resin more than 80% by weight, the viscosity is too high, and consequently the flowability may be lowered so as to deteriorate the application property. Moreover, with a content of the photo-curable resin less than a 5% by weight, the viscosity is too low, and consequently the coated film stability after application and drying is insufficient so that a problem of deteriorating the exposure and developing suitability may be generated.

As a polyfunctional acrylic-based monomer to be contained in a photo-curable resin composition as a photo polymerization monomer, for example, ethylene glycol (meth)acrylate, diethylene glycol di(meth)acrylate, propylene glycol di(meth)acrylate, dipropylene grlycol di(meth) acrylate, polyethylene glycol di(meth)acrylate, polypropylene glycol di(meth)acrylate, hexane di(meth)acrylate, neopentyl glycol di(meth)acrylate, glycerol di(meth) acrylate, glycerol tri(meth)acrylate, glycerol tetra(meth) acrylate, tetra trimethylol propane tri(meth)acrylate, 1,4-butane diol diacrylate, pentaerythritol triacrylate, trimethylol propane triacrylate, pentaerythritol (meth) acrylate, and dipentaerythritol hexa(meth)acrylate can be presented. These components can be used alone or as a mixture thereof.

It is preferable that the polyfunctional acrylate-based monomer contains at least one kind of a monomer having three or more functional groups, and the content thereof is about 30 to 95% by weight in the polyfunctional acrylate-based monomer. Moreover, to the polyfunctional acrylate-based monomer, a monofunctional monomer such as methyl (meth)acrylate, ethyl(meth)acrylate, propyl(meth)acrylate, butyl (meth)acrylate, pentyl(meth)acrylate, ethylhexyl (meth)acrylate, styrene, methyl styrene, and N-vinyl pyrrolidone can be added as a reaction diluting agent.

The content of the polyfunctional acrylate-based monomer as a photo polymerizable monomer in the photo-curable resin composition is 3 to 50% by weight, preferably 5 to 40% by weight by the solid component ratio. With the polyfunctional acrylate-based monomer by less than 3% by weight, a problem arises in that the physical strengths of the film to be formed, such as the bonding strength, and the heat resistance are insufficient. In contrast, with a ratio more than 50% by weight, the stability of the photo-curable resin composition is deteriorated as well as the flexibility of the film to be formed is insufficient. Furthermore, the ratio is important also for improving the dissolving characteristics with respect to the developing liquid. In the case it is outside the range of the optimum amount, even though the pattern resolution is possible, the monomer hardening rate is high so that the scum and the beard are generated in the periphery of the pattern. Moreover, at the outside the above-mentioned range, in a terrible case, resist re-adhesion derived from partial swelling and peel-off is generated so as to inhibit the accurate pattern formation.

Furthermore, in the photo-curable resin composition according to the present invention, a compound having two or more epoxy groups in molecule (epoxy resin) can be included as needed for improving the heat resistance, the adhesion property, the chemical resistance (in particular, the alkaline resistance). Examples of the compound having two or more epoxy groups in a molecule include bisphenol A type epoxy resins, such as Epi Coat 1001, 1002, 1003, 1004, 1007, 1009, and 1010 (produced by Yuka Shell Corp.) bisphenol F type epoxy resins, such as Epi Coat 807 (produced by Yuka Shell Corp.), phenol novolak type epoxy resins, such as EPPN 201, 202 (produced by Nihon Kayaku Corp.), and Epi Coat 154 (produced by Yuka Shell Corp.), and cresol novolak type epoxy resins, such as EOCN 102, 103S, 104S, 1020, 1025, 1027 (produced by Nihon Kayaku Corp.), and Epi Coat 180S (produced by Yuka Shell Corp.). Furthermore, cyclic aliphatic epoxy resin and aliphatic polyglycidyl ethers can be presented as well.

Among these examples, the bisphenol A type epoxy resins, the bisphenol F type epoxy resins, the phenol novolak type epoxy resins, and the cresol novolak type epoxy resins are preferable. Although most of the compounds having two or more epoxy groups in a molecule have a high molecular weight, the glycidyl ethers such as bisphenol A and bisphenol F have a low molecular weight, and those having a low molecular weight are particularly preferable. Moreover, an acrylic copolymer including glycidyl(meth)acrylate, oxetane(meth)acrylate, alicyclic epoxy(meth)acrylate, or the like, in a resin skeleton is also effective.

The epoxy resin is contained in the photo-curable resin composition, in general, from 0 to 60% by weight, preferably 5 to 40% by weight by then solid component ratio. With a less than 5% by weight epoxy resin content, the sufficient alkaline resistance may not be applied to the protection film. In contrast, with a more than 40% by weight epoxy resin content, the epoxy resin amount not contributing to the photo curing is too large so that the storage stability and the developing suitability of the photo-curable resin composition are deteriorated, and thus it is not preferable. Moreover, the epoxy resin is effective also for eliminating the tack of the dried coated film of the photo-curable resin composition, and a sufficient effect can be provided with about 3% by weight addition amount. The epoxy resin reacts with an acid functional group still remaining in the coated film without reacting even after exposure and alkaline development, by heat treatment so as to provide the excellent alkaline resistance to the coated film.

As a polymerization initiator, a radical polymerizable initiator can be used. The radical polymerization initiator is a compound for generating a free radical, for example, by the ultraviolet ray energy. Examples thereof include benzophenone derivatives such as benzoin, and benzophenone, or derivatives such as esters thereof; xantone and thioxantone derivatives; halogen-containing compounds such as chlorosulfonyl, chloromethyl polynuclear aromatic compounds, chrloromethyl heterocyclic compounds, and chloromethyl benzophenone; triadines; fluorenones; haloalkanes; redox couples of a photo reducing pigment and a reducing agent; organic sulfur compounds; and peroxides. Preferably, ketone-based and biimidazol-based compounds, such as Irgacure 184, Irgacure 369, Irgacure 651, Irgacure 907 (produced by Chiba Specialty Chemicals Corp.) Darocure (produced by Merc Corp.), Adeka 1717 (produced by Asahi Denka Kogyo Corp.), and 2,2'-bis(o-chloro phenyl)-4,5,4'-tetra phenyl-1,2'-biimidazol (produced by Kurogane Kasei Corp.) can be presented. The initiators can be used alone or in a combination of two or more. In the case of using two or more, it is preferable not to prohibit the absorption spectrum characteristics.

The radical polymerization initiator is contained in the photo-curable resin composition, in general, from 0.1 to 20% by weight, preferably 1 to 15% by weight by the solid component ratio. With a less than 0.1% by weight radical polymerization initiator addition amount, the photo-curing reaction is not proceeded so that the residual film ratio, the heat resistance, and the chemical resistance tend to be lowered. Moreover, with a more than 20% by weight addition amount, the solubility to the base resin is saturated so that crystals of the initiator are precipitated at the time of spin coating or coated film leveling so as not to maintain the homogeneity of the film surface, and thus a problem of the film ruggedness generation is involved.

In preparing the photo-curable resin composition, the polymerization initiator may be added initially to the resin composition including the above-mentioned polyfunctional acrylate-based monomer and the photo-curable resin, but in the case of a relatively long term storage, it is preferable to disperse or dissolve the same in the resin composition immediately before use.

In the case improvement of the light sensitivity is required, a sensitizer may be added. As the sensitizer to be used, a styryl-based compound or a courmarin-based compound is preferable. Specifically, 2-(p-dimethyl amino styryl) quinoline, 2-(p-diethyl amino styryl) quinoline, 4-(p-dimethyl amino styryl) quinoline, 4-(p-diethyl amino styryl) quinoline, 2-(p-dimethyl amino styryl)-3,3-3H-indol, 2-(p-diethyl amino styryl)-3,3-3H-indol, 2-(p-dimethyl amino styryl)benzoxazol, 2-(p-diethyl amino styryl)-benzoxazol, 2-(p-dimethyl amino styryl)benzimidazol, and 2-(p-diethyl amino styryl)-benzimidazol can be presented.

Moreover, as the courmarin-based compounds, 7-diethyl amino-4-methyl courmarin, 7-ethyl amino-4-trifluoro methyl courmarin, 4,6-diethyl amino-7-ethyl amino courmarin, 3-(2-benzimidazolyl)-7-N,N-diethyl amino courmarin, 7-diethyl amino cyclopenta (c) courmarin, 7-amino-4-trifluoro methyl courmarin, 1,2,3,4,5,3H,6H, 10H-tetra hydro-8-trifluoro methyl (1) benzopyrrano-(9,9a, 1-gh)-quinolidine-10-on, 7-ethyl amino-6-methyl-4-trifluoro methyl courmarin, and 1,2,3,4,5,3H,6H,10H-tetra hydro-9-carbethoxy (1) benzopyrrano-(9,9a,1-gh)-quinolidine-10-on can be presented.

To the above-mentioned photo-curable resin composition, various additives, such as the below-mentioned surfactants and silane coupling agents clan be added as needed.

The surfactants are added to the photo-curable resin composition for ensuring the coating suitability, and the film flatness after drying. Examples thereof include polyoxy ethylene alkyl ethers such as polyoxy ethylene lauryl ether, polyoxy ethylene stearyl ether, and polyoxy ethylene oleyl ether, polyoxy ethylene aryl alkyl ethers such as polyoxy ethylene octyl phenyl ether, and polyoxy ethylene nonyl phenyl ether, polyoxy ethylene dialkyl esters such as polyoxy ethylene dilaurate, and polyoxy ethylene distearate, and fluorine-based surfactants such as Megafac F171, 172, 173 (produced by Dainippon Ink Corp.), Florade FC430, 431 (produced by Sumitomo 3M Corp.), Asahi Guard AG710, Surflone S-382, SC-101, 102, 103, 104, and 105 (Asahi glass Corp.) The content of the surfactant is preferably 2 parts by weight or less with respect to 100 parts by weight of the solid component of the photo-curable resin composition, and more preferably 1 part by weight or less.

Moreover, the silane coupling agents are added for improving the adhesion property to the adjacent substrates or another coating layer. For example, vinyl silanes, acrylic silanes, epoxy silanes, and amino silanes can be presented. More specifically, as a vinyl silane, vinyl trichlorsilane, vinyl tris(β-methoxy ethoxy) silane, vinyl triethoxy silane, vinyl trimethoxy silane, or the like, can be used. Furthermore, as an acrylic silane, γ-methacryloxy propyl trimethoxy silane, γ-methacryloxy propyl methyl dimethoxy silane, or the like, can be used. As an epoxy silane, β-(3,4-epoxy cyclo hexyl) ethyl trimethoxy silane, γ-glycidoxy propyl trimethoxy silane, γ-glycidoxy propyl methyl diethoxy silane, or the like, can be used. Furthermore, as an amino silane, N-β-(amino ethyl)-γ-amino propyl trimethoxy silane, N-β-(amino ethyl)-γ-amino propyl methyltrimethoxy silane, γ-amino propyl triethoxy silane, N-phenyl-γ-amino propyl trimethoxy silane, or the like, can be used. As other silane coupling agents, γ-mercaptopropyl trimethoxy silane, γ-chloropropyl trimethoxy silane, γ-chloropropyl methyl dimethoxy silane, γ-chloro propyl methyl diethoxy silane, or the like, can be used.

In the present invention, in general, a solvent is contained in the above-mentioned photo-curable resin composition in consideration of preparation of a paint and the coating suitability. As a usable solvent, for example, organic solvents including alcohol-based solvents such as methyl alcohol, ethyl alcohol, N-propyl alcohol, and i-propyl alcohol; cellosolve-based solvents such as methoxy alcohol, and ethoxy alcohol; carbitol-based solvents such as methoxy ethoxy ethanol, and ethoxy ethoxy ethanol; ester-based solvents such as ethyl acetate, butyl acetate, methyl methoxy propionate, ethyl ethoxy propionate, and ethyl lactate; ketone-based solvents such as acetone, methyl isobutyl ketone, and cyclo hexanone; cellosolve acetate-based solvents such as methoxy ethyl acetate, ethoxy ethyl acetate, and ethyl cellosolve acetate; carbitol acetate-based solvent such as methoxy ethoxy ethyl acetate, and ethoxy ethoxy ethyl acetate; ether-based solvents such as diethyl ether, ethylene glycol dimethyl ether, diethylene glycol dimethyl ether, and tetrahydro furan; non-protonic amido solvents such as N,N-dimethyl formamido, N,N-dimethyl acetoamido, and N-methyl pyrrolidone; lactone-based solvents such as γ-butylolactone; unsaturated hydrocarbon-based solvents such as benzene, toluene, xylene, and naphthalene; and saturated hydrocarbon-based solvents such as N-heptane, N-hexane, and N-octane can be presented. Among these solvents, cellosolve acetate-based solvents such as methoxy ethyl acetate, ethoxy ethyl acetate, and ethyl cellosolve acetate; carbitol acetate-based solvents such as methoxy ethoxy ethyl acetate, and ethoxy ethoxy ethyl acetate; ether-based solvents such as ethylene glycol dimethyl ether, diethylene glycol dimethyl ether, and propylene glycol diethyl ether; and ester-based solvents such as methyl methoxy propionate, ethyl ethoxy propionate, and ethyl lactate can be used particularly preferably. Particularly preferably, MBA (3-methoxy butyl acetate, $CH_3CH(OCH_3)CH_2CH_2OCOCH_3$), PGMEA (propylene glycol monomethyl ether acetate, $CH_3OCH_2CH(CH_3)OCOCH_3$), DMDG (diethylene glycol dimethyl ether, $H_3COC_2H_4OCH_3$), or a mixture thereof can be used. The solid component concentration is adjusted to 5 to 50% by weight, using these solvents.

As a method of producing a photo-curable resin composition of the present invention, first, each monomer is reacted in a solvent for synthesis like the above-mentioned MBA (3-methoxybutyl acetate) to synthsize a raw material polymer. Next, an isocyanate compound having a radical polymerizable group is added into the obtained raw material polymer solution so that the equivalent weight ratio of isocyanate groups to hydroxyl groups contained in the principal chain of the raw material polymer (NCO/OH) will be 1.0 or more to produce a photo-curable resin (a photo-curable polymer). Further, when the transparency or ultra-violet permeability of the resin is especially required, as mentioned above, while a raw material polymer is produced by using a non-nitrile-based azo polymerization initiator or a peroxide-based polymerization initiator as well as a radical polymerizable group-containing isocyanate compound is introduced using a polymerization inhibitor selected from the group consisting of the compounds represented by the above-mentioned formula (9) or formula (15). Then, an alcohol is added to a reaction liquid containing the photo-curable resin, and the photo-curable resin applied with the alcohol treatment is maturated by, for example, heating at 30 to 170° C. within 72 hours. The reaction liquid is mixed with a resist solvent such as MBA, PGMEA, and DMDG with other resist materials. The solid component concentration in the photo-curable resin composition is in general, in the range of 5 to 85% by weight.

In the case a photo-curable resin mixed with another coating material is dissolved or dispersed in a solvent, the thickening phenomenon is further remarkable compared with the case of a solution of the photo-curable resin alone. Therefore, in the case of preparing a photo-curable resin composition with a photo-curable resin mixed with another material, it is particularly preferable to mix the photo-curable resin with the other material after sufficient maturation by leaving or heating for a predetermined time after the alcohol treatment.

It is preferable that the alcohol to be reacted with the photo-curable resin has a boiling point or an evaporation rate close to that of the solvent for preparing a coating liquid. It is more preferable that both boiling point and evaporation rate are close to those of the coating liquid solvent. More specifically, it is preferable that the difference of the alcohol boiling point and the coating liquid solvent boiling point is within 75° C., in particular, within 40° C., and/or the difference of the alcohol evaporation rate and the coating liquid solvent evaporation rate is within 90[n-BuOAc=100], in particular, within 30[n-BuOAc=100]. In the case the boiling point or the evaporation rate of the alcohol is close to that of the coating liquid solvent, since the alcohol is evaporated together with the coating liquid solvent even if the alcohol remains in the photo-curable resin composition, the coating irregularity can hardly be generated. Since pentanol has a boiling point and an evaporation rate close to those of PGMEA and DMDG, it is preferable to prepare a photo-curable resin composition by applying alcohol treatment of the photo-curable resin with pentanol, and using MBA, PGMEA, DMDG, or a mixture thereof as a resist solvent. Since the pentanol has a boiling point and an evaporation rate also close to those of MBA, it is further preferable to prepare a photo-curable resin composition by using MBA as the synthesis diluting solvent, applying alcohol treatment using pentanol, and further using MBA, PGMEA, DMDG or a mixture thereof as a resist solvent.

The photo-curable resin composition of the present invention that is obtained like this contains a high photo-sensitivity curable resin as the main component and has very high exposure sensitivity. Consequently, the composition can be hardened with a little exposure amount, or a very short exposure time. Accordingly, it is possible to shorten the time required for pattern forming, and it is also possible to save energy for exposure.

In the present invention, the exposure sensitivity of a photo-curable resin can be evaluated with the following method. First, a photo-curable resin composition is applied on a base plate and dried as needed to form a coated film. In here, as a base plate, any plate can be used without problems, if it does not interfere with a course of the pattern forming process of exposure, developing and others like a transparent glass plate. The thickness of the coated film is not especially limited, but normally it should be on the order of 1 to 10 $\mu$m. This coated film is pre-baked at a proper condition, for example, at temperatures from 70 to 150° C. for 1 to 10 minutes. After pre-baking, the coated film is exposed at the known exposure strength and then its thickness is measured. The thickness measured at this step is referred to as "the film thickness before development".

Next, the pre-baked coated film is made contact with a proper developer to dissolve and remove unexposed parts. Washing the remained exposed part if necessary will lead to the development of the coated film. Here, the composition of the developer and the developing conditions should be suitably selected depending on a photo-curable resin composition to be tested. It is needless to say that a preferable developer is such a developer that the exposed part (the hardened part) of a photo-curable resin composition is hardly dissolved and unexposed part is completely dissolved. And the developed coated film is post-baked at a proper condition, for example, at temperatures from 180 to 280° C. for 20 to 80 minutes. After post-baking, the thickness of the coated film is measured, and the thickness id referred to as "the final film thickness after hardening".

From the film thickness before development and the final film thickness after hardening that are measured like this, the residual film rate is calculated according to the following equation.

Residual film rate (%)=(final film thickness after hardening ($\mu$m)÷(film thickness before development ($\mu$m))×100.

On the other hand, the same photo-curable resin composition is applied on a base plate, dried, and pre-baked similarly as mentioned above to form a coated film for reference. This coated film for reference is exposed at exposure strength that is sufficient to completely harden the coated film, and then its film thickness is measured. The film thickness measured at this step is referred to as "the completely exposed film thickness". Next, the coated film that has been completely exposed is post-baked without developing in the same method as that used in the sample film, and then the film thickness of the obtained film is measured by the same method as mentioned above. The film thickness is referred to as "the final film thickness without the developing process". And, from the completely exposed film thickness and the final film thickness without the developing process that are measured like this, the reference residual film rate is calculated according to the following equation.

Reference residual film rate (%)=(final film thickness without the developing process ($\mu$m)÷(completely exposed film thickness ($\mu$m))×100.

After calculating the residual film rate and reference residual film rate, the minimum exposure amount of a photo-curable resin composition is determined to be the most small exposure amount in case where, provided that the error limit is 1%, the residual film rate is equal to the reference residual film rate. It is evaluated that the smaller the minimum exposure amount is, the higher the sensitivity is.

According to the present invention, it is possible to obtain such a very high photo-sensitivity photo-curable resin composition that the minimum exposure amount, which is determined like this, is 100 mJ/cm$^2$ or less, preferably 50 mJ/cm$^2$, and more preferably 35 mJ/cm$^2$ or less.

Color Filter and Liquid Crystal Display Panel

The photo-curable resin composition of the present invention is suitable to form the color layer of a color filter, the protective layer for coating the color layer, and the column-shaped spacer to keep the cell gap of a liquid crystal display panel.

A color filter comprises a black matrix formed with a predetermined pattern on a transparent substrate, a color layer formed with a predetermined pattern on the black matrix, and a protection film formed so as to cover the color layer. A transparent electrode for driving liquid crystals can be formed on the protection film as needed. Moreover, a column-shaped spacer may be formed on the transparent electrode plate, the color layer, or the protection layer, coinciding with the area with the black matrix layer formed.

The color layer has red pattern, a green pattern and a blue pattern disposed in al desired form, such as the mosaic type, the stripe type, the triangular type, and the four pixel arrangement type, and the black matrix is provided between the coloring patterns and a predetermined area outside the color layer formation area. Although the color layer can be formed by various methods, it is preferable to form by the pigment dispersion method using the above-mentioned photo-curable resin composition. That is, a color layer can be formed by dispersing a coloring pigment in the above-mentioned photo-curable resin composition for preparing a coating material, applying the same on one surface side of a transparent substrate, exposing the same by the ultraviolet ray radiation via a photo mask, alkaline development, and heat-curing by a clean oven, or the like. The color layer is formed, in general, in about 1.5 $\mu$m thickness.

The black matrix can be formed by either of the dye method, the pigment dispersion method, the printing method, and the electrochemical deposition method. Furthermore, it can be formed also by chromium deposition, or the like.

The protection film can be formed by applying a coating liquid of the above-mentioned photo-curable resin composition by means of a spin coater, a roll coater, spraying, printing, or the like. The protection film is formed, for example, in about 2 $\mu$m thickness. In the case a spin coater is used, the rotational frequency is set in the range of 500 to 1,500 rotation/minute. The coated film of the photo-curable resin composition is exposed by the ultraviolet ray radiation via a photo mask, alkaline-developed, and heat-cured by a clean oven so as to provide a protection film.

The transparent electrode on the protection film is formed using tin indium oxide (ITO), zinc oxide (ZnO), tin oxide (SnO), or an alloy thereof by a common method such as the sputtering method, the vacuum deposition method, and the CVD method, with a predetermined pattern formed by etching with a photo resist or use of a jig as needed. The thickness of the transparent electrode can be about 20 to 500 nm, preferably about 100 to 300 nm.

The column-shaped spacer on the transparent electrode can be formed also by applying a coating liquid of the above-mentioned photo-curable resin composition by means of a spin coater, a roll coater, spraying, printing, or the like, exposing the same by the ultraviolet ray radiation via a photo mask, alkaline development, and heat-curing by a clean oven. The column-shaped spacer is Deformed, for example, in about 5 μm height. Like the case of forming the protection film, the rotational frequency of the spin coater can be set in the range of 500 to 1,500 rotation/minute.

A liquid crystal display panel can be obtained by forming an alignment layer on the inner surface side of the color filter accordingly produced, facing the same to an electrode substrate, and filling a liquid crystal in the gap part and sealing.

Effects of the Invention

As mentioned above, the high photo-sensitivity curable resin provided by the present invention has a principal chain that is composed of at least a constitutional unit having an acid functional group and an other constitutional unit having a hydroxyl group, and has a molecular structure in which an isocyanate compound containing a radical polymerizable group is amide-bonded with at least a part of said acid functional group and/or urethane-bonded with at least a part of said hydroxyl group via the isocyanate group of said isocyanate compound, and at the same time, the feed amount of said isocyanate compound containing the radical polymerizable group into the high photo-sensitivity curable resin is controlled to be 1.0 or more in terms of the equivalent ratio of isocyanate groups to hydroxyl groups in the principal chain (NCO/OH).

More preferably, the feed amount of the constitutional unit having the hydroxyl group is controlled to be 14 mol % or more on the basis of the whole amount of each constitutional unit that constitutes the principal chain and side chains of the high photo-sensitivity curable resin. Consequently, the high photo-sensitivity curable resin contains many radical polymerizable groups as side chains, and is very sensitive so that it can be hardened with a little exposure amount in a short time.

Furthermore, the high photo-sensitivity curable resin of the present invention is treated with alcohol as need. Such an alcohol treated resin is hardly caused to increase in molecular weight and viscosity even if it is dissolved or dispersed in a solvent, so it is very stable compared with a resin not treated with alcohol. Consequently, such an alcohol treated resin is excellent in shelf life when it is prepared in a solution and can be preserved for long time at room temperature. Moreover, the solution of such an alcohol treated resin is easily handled because it does not increase in viscosity during usage.

Further, when a high photo-sensitivity curable resin of the present invention is produced, a photo-curable resin having very excellent transparency can be obtained by preparing a raw material polymer by using a non-nitrile-based azo polymerization initiator or a peroxide-based polymerization initiator and/or by introducing an isocyanate compound containing the radical polymerizable group with the use of any polymerization inhibitor selected from the groups of compounds shown in the above-mentioned formula (9) or formula (15). In addition, if transparency is high, it will be effective to improve sensitivity because light reaches sufficiently in the interior part of the coated film of a photo-curable resin.

Consequently, a photo-curable resin composition, the main component of which is a photo-curable resin of the present invention, has high sensitivity and can be hardened with a little exposure amount in a short time. Furthermore, because a photo-curable resin composition of the present invention is hardly caused to increase in viscosity, it has a high shelf life and can provide fine films and patterns without coating unevenness. In addition, a photo-curable resin composition of the present invention can be used when high transparency is required.

And, a photo-curable resin composition of the present invention is suitable for photoresist materials to form especially color layers of a color filter, protective layers to coat the color layers, and column-shaped spacers to keep the cell gap of a liquid crystal display panel. That is, if a photo-curable resin composition of the present invention is used, it is possible to form color layers, protection films, and column-shaped spacers that are high productivity because of its high sensitivity and are excellent in dimensional stability because of its good coating property, moreover, it is also possible to meet the transparency required to the color layers and protection films.

EXAMPLES

Example 1

<Synthesis of a High Sensitivity Resin (1')>

Following quantities of benzyl methacrylate, styrene, acrylic acid, and 2-hydroxy ethyl methacrylate were dissolved into 650 g of 3-methoxy butyl acetate together with 5 g of azo bis isobutyronitrile (AIBN). The obtained solution was dropped into 1,000 g of 3-methoxy butyl acetate in a polymerization vessel at 100° C. for 6 hours and polymerized. As a result, a solution of a raw material polymer was obtained.

| | |
|---|---|
| Benzyl methacrylate (BzMA): | 250 g. |
| Styrene (St): | 350 g. |
| Acrylic acid (AA): | 200 g. |
| 2-hydroxy ethyl methacrylate (HEMA): | 200 g. |

Next, a mixture of the following composition was added at one time into the raw material polymer solution and stirred in a heating condition to produce a reaction liquid containing a high photo-sensitivity curable resin (1') before alcohol treatment.

| | |
|---|---|
| 2-methacryloyloxyethyl isocyanate (MOI): | 240 g. |
| Dibutyl tin laurate: | 1 g. |
| 3-methoxy butyl acetate: | 2,260 g. |
| Hydroquinone (HQ): | 2.5 g. |

The reaction was continued until a peak at 2200 cm$^{-1}$ depending on an isocyanate group disappeared while monitoring the progress of the reaction with IR (Infrared spectroscopy).

The feed rate (mol %) of each monomer was as follows: benzyl methacrylate:styrene:acrylic acid:2-hydroxyethyl methacrylate:2-methacryloyloxyethyl isocyanate= 13.3:31.7:26.2:14.4:14.4. Furthermore, the equivalent ratio of isocyanate groups of 2-methacryloyloxyethyl isocyanate to hydroxyl groups of 2-hydroxyethyl methacrylate (NCO/OH) was 1.0.

The solid content of the obtained reaction liquid was 25.5 wt. %, and the viscosity was 77.3 mPa·s/25° C. After the obtained reaction liquid was applied on a glass plate, the plate was dried at room temperature under reduced pressure all night to remove solvents. The acid value of the obtained solid was 125.5 mg KOH/g, and the weight-average molecular weight was 42,500.

Various physical properties were measured by the following methods.

a. Solid component: 0.7 to 0.8 g of a reaction solution measured accurately was placed in an aluminum plate, and dried at 105° C. for 6 to 7 hours by a hot air dryer. The accurate weight was measured immediately for finding the ratio of the measured dried weight With respect to the reaction solution weight.

b. Viscosity (mPa·s/25° C.): With a rotor No. 1 used, the viscosity was measured by a B type viscometer at 60 rpm.

c. Acidic value: The acidic value was found by dissolving a specimen in an acetone, and the neutralization titration by NaOH of 1/10 N with a cresol red used as an indicator.

d. Hydroxyl group value: The hydroxyl group value was found from the KOH weight necessary for neutralizing an acidic value capable of acetylating 1 g of a dried solid content.

e. Weight average molecular weight: GPC measurement condition and column are as follows.

Column: Schodex GPC KF-805L (produced by Showa Denko Corp.)
Flow rate: 1.0 (ml/min)
Temperature: 40° C.
Eluent: Tetrahydrofuran
Detector: RI <Alcohol Treatment of High Photo-sensitivity Curable Resin (1')>

In the reaction liquid containing a high photo-sensitivity curable resin (1') (a 3-methoxy butyl acetate solution of 25.5 wt. % in solid content), 1-pentanol was added so that the rate of 1-pentanol was 10 wt. %, and the mixture was matured. Part of the reaction liquid in which 1-pentanol had been added was heated and stirred at 90° C. for 11 hours to be matured. Further, another part of the reaction liquid was heated and stirred at 70° C. for 30 hours to be matured. After being matured, in either case, it was confirmed with FT-IR spectrum that the area ratio shown by an acid anhydride group [1783~1822 cm$^{-1}$]/a benzene ring [683~721 cm$^{-1}$] had become 0.03 or less. Thus, a reaction liquid containing a high photo-sensitivity curable resin (1), which is an alcohol treated material of a high photo-sensitivity curable resin (1'), was obtained. The concentration of solid content in the obtained reaction liquid was 23.2 wt. %, and viscosity was 49.5 mPa·s/25° C.

<Preparation of Photo-curable Resin Composition (1)>

Following quantities of each material were stirred and mixed at room temperature, and a photo-curable resin composition (1) was obtained, as a result.

The reaction liquid containing the above-mentioned high sensitivity resin (1) (the solid content is 23.2 wt. %): 59.0 weight parts.

Dipentaerythritol penta acrylate (SR 399 made by Sartomer Co.): 11.0 weight parts.

Orthocresol novolak type epoxy resin (Epicoat 180S70 made by Petro. Chemical Shell Epoxy Co.): 15.0 weight parts.

2-methyl-1-(4-methyl thiophenyl)-2-morpholino propanone-1: 2.1 weight parts.

2,2'-bis(o-chlorophenyl)-4,5,4',5'-tetraphenyl-1,2'-biimidazole: 1.5 weight parts.

Diethylene glycol dimethyl ether: 59.0 weight parts.

3-methoxy butyl acetate: 7.4 weight parts.

Example 2

Except for the feed rate of each monomer and the equivalent ratio of isocyanate groups of 2-methacryloyloxyethyl isocyanate to hydroxyl groups of 2-hydroxyethyl methacrylate were changed as follows, resin synthesis, alcohol treatment, and composition preparation were carried out as Example 1, and a photo-curable resin composition (2) containing a high photo-sensitivity photo-curable resin (2) was obtained.

BzMA:St:AA:HEMA:MOI=12.9:25.6:25.3:16.4:19.7.
NCO/OH=1.2.

Example 3

Except for the feed rate of each monomer and the equivalent ratio of isocyanate groups of 2-methacryloyloxyethyl isocyanate to hydroxyl groups of 2-hydroxyethyl methacrylate were changed as follows, resin synthesis, alcohol treatment, and composition preparation were carried out as Example 1, and a photo-curable resin composition (3) containing a high sensitivity resin (3) was obtained.

BzMA:St:AA:HEMA:MOI=12.3:24.4:24.1:15.7:23.5.
NCO/OH=1.5.

Example 4

Except for changing a polymerization initiator in the preparation of a raw material polymer from 5 g of AIBN (one of nitrites) to the same amount of dimethyl-2,2'-azobis (2-methyl propionate)(DAMP, one of non-nitrites), and changing a polymerization inhibitor in the reaction of 2-methacryloyloxyethyl isocyanate from 2.5 g of hydroquinone (HQ) to the same amount of 3,5-di-tert-butyl-4-hydroxy toluene(BHT), resin synthesis, alcohol treatment, and composition preparation were carried out as Example 1, and a photo-curable resin composition (4) containing a high sensitivity resin (4) was obtained.

Example 5

Except for having dropped 2-methacryloyloxyethyl isocyanate into a raw material polymer solution and reacted it, the same procedures as example 4 were carried out, and a photo-curable resin composition (5) containing a high sensitivity resin (5) was obtained.

Example 6

Except for the feed rate of each monomer and the equivalent ratio off isocyanate groups of 2-methacryloyloxyethyl isocyanate to hydroxyl groups of 2-hydroxyethyl methacrylate were changed as follows, resin synthesis, alcohol treatment, and composition preparation were carried out as Example 1, and a photo-curable resin composition (6) containing a high sensitivity resin (6) was obtained.

BzMA:St:AA:HEMA:MOI=0 35.7:24.0:18.3:21.9.
NCO/OH=1.2.

Example 7

Except for having dropped 2-methacryloyloxyethyl isocyanate into a raw material polymer solution and reacted it, the same procedures as Example 6 were carried out, and a photo-curable resin c o$_m$position (7) containing a high sensitivity resin (7) was obtained.

Example 8

Except for the feed rate of each monomer and the equivalent ratio of isocyanate groups of 2-methacryloyloxyethyl isocyanate to hydroxyl groups of 2-hydroxyethyl methacrylate were changed as follows, resin synthesis, alcohol treatment, and composition preparation were carried out as Example 1, and a photo-curable resin composition (8) containing a high sensitivity resin (8) was obtained.

BzMA:St:AA:HEMA:MOI=0:38.2:21.2:18.5:22.2. NCO/OH=1.2.

Example 9

Except for having dropped 2-methacryloyloxyethyl isocyanate into a raw material polymer solution and reacted it, the same procedures as Example 8 were carried out, and a photo-curable resin composition (9) containing a high sensitivity resin (9) was obtained.

Example 10

Except for changing a polymerization initiator in the preparation of a raw material polymer from 5 g of AIBN (one of nitriles) to the same amount of dimethyl-2,2'-azobis (2-methyl propionate)(DAMP, one of non-nitriles), changing a polymerization inhibitor in the reaction of 2-methacryloyloxyethyl isocyanate from 2.5 g of hydroquinone (HQ) to the same amount of 3,5-di-tert-butyl-4-hydroxy toluene(BHT), and having dropped 2-methacryloyloxyethyl isocyanate into a raw material polymer solution and reacted it, the same procedures as Example 6 were carried out, and a photo-curable resin composition (10) containing a high sensitivity resin (10) was obtained.

Example 11

Except for changing a polymerization initiator in the preparation of a raw material polymer from 5 g of AIBN (one of nitriles) to the same amount of dimethyl-2,2'-azobis (2-methyl propionate)(DAMP, one of non-nitriles), changing a polymerization inhibitor in the reaction of 2-methacryloyloxyethyl isocyanate from 2.5 g of hydroquinone (HQ) to the same amount of 3,5-di-tert-butyl-4-hydroxy toluene(BHT), and having dropped 2-methacryloyloxyethyl isocyanate into a raw material polymer solution and reacted it, the same procedures as Example 8 were carried out, and a photo-curable resin composition (11) containing a high sensitivity resin (11) was obtained.

Example 12

<Preparation of a Photo-curable Resin Composition (12) and (12')>

Following quantities of each material were stirred and mixed at room temperature, and a photo-curable resin composition (12) was obtained, as a result.

The reaction liquid containing a high sensitivity resin (1) obtained by Example 1 (the solid content is 23.2 wt. %): 97.0 weight parts.

Dipentaerythritol penta acrylate (SR 399 made by Sartomer Co.): 18.0 weight parts.

Orthocresol novolak type epoxy resin (Epicoat 180S70 made by Petro. Chemical Shell Epoxy Co.): 25.0 weight parts.

2-benzyl-2-N,N-dimethylamino-1-(4-morpholinophenyl)-1-butanone: 2.5 weight parts.

2,2'-bis(o-chlorophenyl)-4,5,4',5'-tetraphenyl-1,2'-biimidazole: 2.0 weight parts.

Polyoxyethylene octylphenyl ether (Nonion HS-210 made by Nippon Oil & Fats Co,. Ltd.): 3.6 weight parts.

Propylene glycol monomethyl ether acetate: 59.0 weight parts.

Further, a photo-curable resin composition (12') was obtained by using the reaction liquid containing a high sensitivity resin (1'), which was obtained in Example 1 and not treated with alcohol, in place of the reaction liquid containing a high sensitivity resin (1) in the above-mentioned composition.

<Preservation Test>

When the viscosity of the above-mentioned photo-curable resin composition (12) and photo-curable resin composition (12') was measured using Brookfield type viscometer just after their preparation, the viscosity of the photo-curable resin composition (12') was 20. 0 mPa·s/25° C., and that of the alcohol treated photo-curable resin composition (12) was 18.5 mPa·s/25° C.

Example 13

<Formation of a Black Matrix>

Following quantities of components were mixed and dispersed sufficiently in a sand mill to prepare a dispersion liquid of black pigment.

Black pigment: 23 weight parts.

Polymer dispersing agent (Disperbyk 111 made by Big Chemie Japan Co., Ltd.): 2 weight parts.

Solvent (diethylene glycol dimethyl ether): 75 weight parts.

Next, a composition for a light shielding layer was obtained by sufficiently mixing the following quantities of components.

The above-mentioned dispersion liquid of black pigment: 61 weight parts.

The photo-curable resin composition (1) of Example 1: 20 weight parts.

Diethylene glycol dimethyl ether: 30 weight parts.

Then, the above-mentioned composition for a light shielding layer was applied on a glass substrate of 1.1 mm in thickness (AL material made by Asahi Glass Co. Ltd.) with a spin coater, and the applied glass plate was dried at 100° C. for 3 minutes to form a light shielding layer of about 1 μm in film thickness. Then, after being exposed to a light shielding pattern with an ultrahigh pressure mercury lamp, the light shielding layer was developed with a 0.05% potassium hydroxide aqueous solution. After that, heating treatment was performed on the substrate by letting it alone in an atmosphere of 180° C. for 30 minutes, and a black matrix was formed in the area where a light shielding part should be formed.

<Formation of a Color Layer>

On the substrate where a black matrix had been formed as mentioned above, a red photo-curable resin composition having the following composition was applied by a spin coating method (the applied thickness is 1.5 μm). And the applied substrate was dried at 70° C. for 30 minutes in an oven.

Then, a photomask was arranged at 100 μm distance from the coated film of the red photo-curable resin composition and ultraviolet ray was irradiated only in the area corresponding to the area where a color layer should be formed for 10 second using an ultrahigh pressure mercury lamp of 2.0 kW by a proximitialigner. And then, the substrate was dipped into a 0.05% potassium hydroxide aqueous solution (the liquid temperature is 23° C.) for 1 minute and alkali developed to remove only non-hardened parts of the coated film of the red photo-curable resin composition. After that, heating treatment was performed on the substrate by letting it alone in an atmosphere of 180° C. for 30 minutes, and a red relief pattern was formed in the area where a red pixel should be formed.

Next, a green relief pattern was formed in the area where a green pixel should be formed using a green photo-curable resin composition having the following composition in the same process by which the red relief pattern was formed.

Furthermore, a blue relief pattern was formed in the area where a blue pixel should be formed using a blue photo-curable resin composition having the following composition in the same process by which the red relief pattern was formed, and, as a result, a color layer that composed of red (R), green (G), and blue (B) was made.

a. The composition of a red photo-curable resin composition.
   C. I. Pigment Red 177: 10 weight parts.
   Polysulfone type polymer dispersing agent: 3 weight parts.
   The photo-curable resin composition (1) of Example 1: 5 weight parts.
   3-methoxybutyl acetate: 82 weight parts.
b. The composition of a green photo-curable resin composition.
   C. I. Pigment Green 36: 10 weight parts.
   Polysulfone type polymer dispersing agent: 3 weight parts.
   The photo-curable resin composition (1) of Example 1: 5 weight parts.
   3-methoxybutyl acetate: 82 weight parts.
c. The composition of a blue photo-curable resin composition.
   C. I. Pigment Blue: 10 weight parts.
   Polysulfone type polymer dispersing agent: 3 weight parts.
   The photo-curable resin composition (1) of Example 1: 5 weight parts.
   3-methoxybutyl acetate: 82 weight parts.

Example 14

<Coating of the Photo-curable Resin Composition (1)>

On the glass substrate on which a color layer had been formed in Example 13, the photo-curable resin composition (1) of Example 1 was applied by a spin coating method and dried to form a coated film of 2 μm in dry film thickness.
<Formation of a Protection Film>

A photomask was arranged at 100 μm distance from the coated film of the photo-curable resin composition (1) and ultraviolet ray was irradiated only in the area corresponding to the area where a color layer should be formed for 10 second using an ultrahigh pressure mercury lamp of 2.0 kW by a proximitialigner. And then, the substrate was dipped into a 0.05% potassium hydroxide aqueous solution (the liquid temperature is 23° C.) for minute and alkali developed to remove only non-hardened parts of the coated film of the photo-curable resin composition. After that, heating treatment was performed on the substrate by letting it alone in an atmosphere of 200° C. for 30 minutes, and a protection film was formed, thus obtaining a color filter of the present invention.

Example 15

<Coating of the Photo-curable Resin Composition (12)>

On the glass substrate on which a color layer had been formed in Example 13, the photo-curable resin composition (12) that had been obtained in Example 12 was applied by a spin coating method and dried to form a coated film of 5 μm in dry film thickness.
<Formation of a Spacer>

A photomask that has been designed so as to be able to form an exposure pattern having a prescribed shape, size, and space was arranged at 100 μm distance from the coated film of the photo-curable resin composition (12) and ultraviolet ray was irradiated only in the area where a spacer should be formed on a black matrix for 10 second using an ultrahigh pressure mercury lamp of 2.0 kW by a proximitialigner. And then, the substrate was dipped in to a 0.05% potassium hydroxide aqueous solution (the liquid temperature is 23° C.) for 1 minute and alkali developed to remove only non-hardened parts of the coated film of the photo-curable resin composition. After that, heating treatment was performed on the substrate by letting it alone in an atmosphere of 200° C. for 30 minutes, and a fixing spacer was formed, thus obtaining a color filter of the present invention.

Example 16

On the surface containing a fixing spacer of a color filter that had been obtained in Example 15, a transparent electrode film was made by the CD magnetron sputtering method in which substrate temperature was 200° C., discharging gases were argon and oxygen and the target was ITO. After that, an alignment layer comprised of polyimide was formed on the transparent electrode film.

Then, the above-mentioned color filter and the glass substrate on which TFT had been formed were joined together at 150° C. and under a pressure of 0.3 kg/cm2 using an epoxy resin as a sealing material to assemble a cell. And then, a liquid crystal display of the present invention was produced by sealing TN liquid crystal into the cell.

Example 17

On the color layer of the glass substrate on which a color layer had been formed in Example 13, or on the protection film of the color filter on which a color layer and protection film had been formed in Example 14, a transparent electrode film was formed by the DC magnetron sputtering method in which substrate temperature was 200° C. discharging gases were argon and oxygen and a target was ITO. After that, a spacer was formed on the transparent electrode film in the same process as Example 15, further an alignment layer which is comprised of polyimide was formed, thus obtaining a color filter.

Then, the above-mentioned color filter and the glass substrate on which TFT had been formed were joined together at 150° C. and under a pressure of 0.3 kg/cm2 using an epoxy resin as a sealing material to assemble a cell. And then, a liquid crystal display of the present invention was produced by sealing TN liquid crystal into the cell.
<Analysis with $^1$H-NMR>

After 5 g of the reaction liquid containing the alcohol treated high sensitive resin (1) that had been obtained in Example 1 (a 3-methoxybutyl acetate solution of 23.2 wt. % in solid content) was diluted with 5 g of tetrahydrofuran, the diluted reaction liquid was dropped little by little with a dropper into 300 g of isopropanol while stirring. The supernatant liquid was removed, the solid content hardened on the basal plane was completely dissolved again in 5 g of tetrahydrofuran, and the solution was dropped into 300 g of isopropanol similarly. The obtained solid content was completely dissolved: in 20 g of tetrahydrofuran, and the solution was dropped into 300 g of hexane similarly. Deposited solid was filtered and dried under reduced pressure at room temperature all night to prepare a sample. The weight-average molecular weight of the obtained sample was 94,000. This sample was completely dissolved in heavy DMSO and analyzed with $^1$H-NMR. The results are shown in the following.

| $^1$H-NMR (DMSO-d) | σ ppm |
|---|---|
| σ 0.2~1.1 | (m, 12H) |
| σ 1.1~1.8 | (m, 19H) |
| σ 1.85 | (s, 3H) |
| σ 3.27 | (b, 2H) |
| σ 3.51 | (b, 2H) |
| σ 3.90 | (b, 2H) |
| σ 4.08 | (b, 2H) |
| σ 4.75 | (b, 1H) |
| σ 4.90 | (b, 2H) |
| σ 5.63 | (s, 1H) |
| σ 6.05 | (s, 1H) |
| σ 7.11 | (b, 23H) |
| σ 7.31 | (b, 6H) |
| σ 12.04 | (b, 2H) |

From the $^1$H-NMR analysis, the unit ratio (mol ratio) of each constitutional unit in the photo-curable resin (1) treated by the reprecipitation refining was that benzyl methacrylate:styrene:acrylic acid:2-hydroxyethyl methacrylate:2-methacryloyloxyethyl isocyanate=2:5:4:2:1. Furthermore, in the purified high photo-sensitivity curable resin (1), the introduction amount (mol) of 2-methacryloyloxyethyl isocyanate (MOI) to 100 mol of the constitutional unit of the principal chain was 8.02 mol.

In the same method, reaction liquids containing high sensitivity resins of (2) to (11), which had been obtained in other examples, were reprecipitated and refined, and analyzed with $^1$H-NMR. The results of the analysis are shown in Table 1 together with the sensitivity evaluation mentioned later.

<Evaluation of Sensitivity>

The photo-curable resin composition (1) that had been obtained in Example 1 was applied on a glass substrate of 10 cm$^2$ with a spin coater (Type 1H-DX2, manufactured by MIKASA Co.) and dried to form a coated film of 2 μm in dry film thickness. The coated film was heated at 90° C. for 3 minutes on a hot plate. After heating, a photomask was arranged at 100 μm distance from the coated film and ultraviolet ray was irradiated in each area of 4 parts of the film divided equally at the intensity of 25, 35, 50, and 100 mJ/cm$^2$ (in terms of 405 nm illumination), respectively, by UV aligner equipped with an ultrahigh pressure mercury lamp of 2.0 kW (Type MA 1200, made by Dainippon Screen Co., Ltd.).

After the irradiation of ultraviolet ray, a piece of rectangular-shaped coated film of about 1 mm×3 mm in size was shaved off from each of these 4 areas to partly unshroud the glass substrate. And the film thickness of each irradiation area was measured by a stylus type surface-roughness measuring device (Dektak 1600 made by Nippon Anerba Co., Ltd.). The thickness was referred to as the film thickness before development.

Then, a 0.05 wt. % of potassium hydroxide aqueous solution was splayed on the exposed parts of the coated film for 60 seconds by a spin developing machine (Applied Process Technology, INK, MODEL:915) to dissolve and remove unexposed parts. Then remaining exposed parts were developed by washing with pure water for 60 seconds. After the development, the films of the exposed parts were heated at 200° C. for 30 minutes in a clean oven (SCOV-250 Hy-So, made by Ninsoku Laboratory Co., Ltd.). And the film thickness of each area of the obtained film was measured by the same method mentioned above. The thickness was referred to as the final film thickness after hardening.

From the film thickness before development and the final film thickness after hardening that were thus measured, the residual film rate was calculated according to the following equation.

Residual film rate (%)=(final film thickness after hardening (μm)÷film thickness before development (μm)×100.

On the other hand, the reference Residual film rate was determined by the following manner. First, the completely exposed film thickness of the photo-curable resin composition (1) was measured by the same method as the samples, except for the whole surface of the coated film was exposed at the strength of 100 mJ/cm$^2$. The film thickness of the obtained film was measured in the same method as mentioned above. The thickness was referred to as the completely exposed film thickness.

Next, after the coated film that had been exposed at 100 mJ/cm$^2$ was only heated in the same method as the samples without developing, the film thickness of the obtained film was measured in the same method as mentioned above. The thickness was referred to as the final film thickness without the developing process. And, from the completely exposed film thickness and the final film thickness without the developing process that were measured, the reference residual film rate was calculated according to the following formula.

The reference residual film rate (%)=(the final film thickness without the developing process (μm)÷the completely exposed film thickness (μm)×100.

The minimum exposure amount of the photo-curable resin composition (1) was determined to be the most small exposure amount when, provided that the error limit is 1%, the residual film rate thus calculated is equal to the reference residual film rate.

Furthermore, in the same method as mentioned above, the coated films of photo-curable resin compositions of (2) to (11), which had been obtained in other examples, were formed. And about the coated films, the film thickness before development, the final film thickness after hardening, the completely exposed film thickness, and the final film thickness without the developing process were measured. Then, the minimum exposure amount of each photo-curable resin composition of (2) to (11) was determined.

Thus, the minimum exposure amount was determined on each photo-curable resin composition of (1) to (11). These results are shown in Table 1.

TABLE 1

| | Composition ratio; BzMA:St:AA: HEMA:MOI | NCO/OH | Polymerization initiator/ Polymerization inhibitor | With or without dropping | $^1$H-NMR (mol) | Minimum exposure amount for hardening (mJ) |
|---|---|---|---|---|---|---|
| High photo-sensitivity resin/Photo-curable resin composition (1) | 13.3:31.7:26.2:14:4 | 1.0 | AIBN/HQ | Not dropped | 8.02 | 100 |

TABLE 1-continued

| | Composition ratio; BzMA:St:AA: HEMA:MOI | NCO/OH | Polymerization initiator/ Polymerization inhibitor | With or without dropping | $^1$H-NMR (mol) | Minimum exposure amount for hardening (mJ) |
|---|---|---|---|---|---|---|
| High photo-sensitivity resin/Photo-curable resin composition (2) | 12.9:25.6:25.3:16.4:19.7 | 1.2 | AIBN/HQ | Not dropped | 12.0 | 50 |
| High photo-sensitivity resin/Photo-curable resin composition (3) | 12.3:24.4:24.1:15.7:23.5 | 1.5 | AIBN/HQ | Not dropped | 16.0 | 35 |
| High photo-sensitivity resin/Photo-curable resin composition (4) | The same as (1) | 1.0 | DAMP/BHT | Not dropped | 8.07 | 50 |
| High photo-sensitivity resin/Photo-curable resin composition (5) | The same as (4) | 1.0 | DAMP/BHT | Dropped | 8.05 | 50 |
| High photo-sensitivity resin/Photo-curable resin composition (6) | 0:35.7:24.0:18.3:21.9 | 1.2 | AIBN/HQ | Not dropped | 18.7 | 50 |
| High photo-sensitivity resin/Photo-curable resin composition (7) | The same as (6) | 1.2 | AIBN/HQ | Dropped | 19.5 | 35 |
| High photo-sensitivity resin/Photo-curable resin composition (8) | 0:38.2:21.2:18.5:22.2 | 1.2 | AIBN/HQ | Not dropped | 19.5 | 50 |
| High photo-sensitivity resin/Photo-curable resin composition (9) | The same as (8) | 1.2 | AIBN/HQ | Dropped | 20.3 | 35 |
| High photo-sensitivity resin/Photo-curable resin composition (10) | The same as (6) | 1.2 | DAMP/BHT | Dropped | 18.7 | 35 |
| High photo-sensitivity resin/Photo-curable resin composition (11) | The same as (8) | 1.2 | DAMP/BHT | Dropped | 20.7 | 25 |

<Evaluation of a Shelf Life>

The reaction liquid containing the high sensitivity resin (1') that had not been treated with alcohol, and the reaction liquid containing the high sensitivity resin (1) that had been treated with alcohol, both of which reaction liquids had been obtained in Example 1 were reserved in a cool storage condition, reserved at room temperature, and reserved at a high temperature. And, after the reservation period was ended, the viscosity of each reaction liquid was measured with Brookfield viscometer in the same way as measurement carried out just after preparation.

Moreover, the photo-curable resin composition (12') that had not been treated with alcohol, and the photo-curable resin composition (12) that had been treated with alcohol, both of which compositions had been obtained in Example 12 were reserved in a cool condition, and reserved at room temperature. And, after the reservation period was ended, their viscosity was measured similarly with Brookfield viscometer.

The ratio of viscosity after the end of the reservation period to viscosity just after preparation is shown in Tables 2 and 3.

TABLE 2

| | High sensitivity resin (1) (Treated with alcohol) | High sensitivity resin (1') (Not treated with alcohol) |
|---|---|---|
| Cool storage (For 2 weeks) | 1.001 times | 1.011 times |
| Reservation at room temperature (For 2 weeks) | 1.008 times | 1.172 times |

TABLE 2-continued

| | High sensitivity resin (1) (Treated with alcohol) | High sensitivity resin (1') (Not treated with alcohol) |
|---|---|---|
| Reservation at hot temperature (At 70° C., for 1.5 days) | 1.020 times | 1.500 times |

TABLE 3

| | High sensitivity resin (12) (Treated with alcohol) | High sensitivity resin (12') (Not treated with alcohol) |
|---|---|---|
| Cool storage (For 2 weeks) | 1.032 times | 1.049 times |
| Reservation at room temperature (For 2 weeks) | 1.064 times | 1.208 times |

<Evaluation of Transparency>

The reaction liquid containing the high sensitivity resin (1) that had been obtained in Example 1, that is, the reaction liquid after alcohol treatment was diluted with 3-methoxybutyl acetate to prepare a solution of 20 wt. % in resinous solid content. The solution was put in a quartz cell of 1 cm square, and then the light transmittance of the solution was measured in the range of 350 to 550 nm.

Similarly, also concerning the reaction liquid containing the high sensitivity resin (4) that had been obtained in Example 4 and the reaction liquid containing the high sensitivity resin (5) that had been obtained in Example 5, light transmittance was measured. The measurement results are shown in Table 4.

TABLE 4

|  | Composition ratio | Polymerization initiator/ Polymerization inhibitor | With or without dropping | 360 nm | 400 nm | 485 nm |
|---|---|---|---|---|---|---|
| High sensitivity resin (1) | The same | AIBN/HQ | Not dropped | 24(%) | 64(%) | 66(%) |
| High sensitivity resin (4) |  | DAMP/BHT | Not dropped | 70 | 87 | 94 |
| High sensitivity resin (5) |  | DAMP/BHT | Dropped | 35 | 73 | 90 |

What is claimed is:

1. A high photo-sensitivity curable resin comprising a polymer having a principal chain which comprises a constitutional unit having an acid functional group and a constitutional unit having a hydroxyl group, wherein an isocyanate compound containing a radical polymerizable group is amide-bonded with at least a part of said acid functional group via an isocyanate group of the isocyanate compound and/or urethane-bonded with at least a part of said hydroxyl group via the isocyanate group of the isocyanate compound, and the feed amount of said isocyanate compound containing the radical polymerizable group is 1.0 or more in terms of the equivalent ratio of said isocyanate group to said hydroxyl group in the principal chain (NCO/OH).

2. A high photo-sensitivity curable resin according to claim 1, wherein said equivalent ratio (NCO/OH) is 1.2 or more.

3. A high photo-sensitivity curable resin according to claim 1, wherein said equivalent ratio (NCO/OH) is 2.0 or less.

4. A high photo-sensitivity curable resin according to claim 1, wherein the feed amount of said constitutional unit having the hydroxyl group is 14 mol % or more on the basis of the total amount of each constitutional unit constituting the principal chain and side chains of said high photo-sensitivity curable resin.

5. A high photo-sensitivity curable resin according to claim 4, wherein the feed amount of said constitutional unit having the acid functional group is 10 to 30 mol %, that of said constitutional unit having the hydroxyl group is 14 mol % or more, and that of said isocyanate compound containing the radical polymerizable group is 14 mol % or more on the basis of the total amount of each constitutional unit constituting the principal chain and side chains of said high photo-sensitivity curable resin, acid value is 80 to 140 mg KOH/g, and the weight-average molecular weight is 10,000 to 100,000 in the terms of polystyrene.

6. A high photo-sensitivity curable resin according to claim 5, wherein the feed amount of said constitutional unit having the acid functional group is 10 to 30 mol %, that of said constitutional unit having the hydroxyl group is 15 to 19 mol %, and that of said isocyanate compound containing the radical polymerizable group is 18 to 26 mol % on the basis of the total amount of each constitutional unit constituting the principal chain and side chains of said high photo-sensitivity curable resin, an acid value is 90 to 120 mg KOH/g, and the weight-average molecular weight is 30,000 to 60,000 in the terms of polystyrene.

7. A high photo-sensitivity curable resin according to claim 1, wherein said principal chain comprises a constitutional unit shown in the following formula (1) and a constitutional unit shown in the following formula (2):

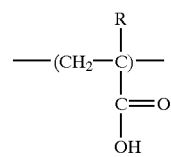

Formula (1)

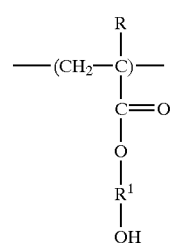

Formula (2)

wherein R is hydrogen or alkyl having 1 to 5 carbon atoms, and $R^1$ is alkylene having 2 to 4 carbon atoms.

8. A high photo-sensitivity curable resin according to claim 1, wherein an alcohol is ester-bonded with at least a part of acid functional group in said principal chain via a hydroxyl group of said alcohol.

9. A high photo-sensitivity curable resin according to claim 1, wherein the principal chain part of said high photo-sensitivity curable resin is formed by polymerizing a compound having a double bond containing group and an acid functional group and a compound having a double bond containing group and a hydroxyl group with a non-nitrile-based azo polymerization initiator or a peroxide-based polymerization initiator.

10. A high photo-sensitivity curable resin according to claim 9, wherein light transmittance is 60% or more at 400 nm when a 3-methoxybutyl acetate solution of 20 wt. % as resinous solid content is put into a quartz cell of 1 cm square.

11. A high photo-sensitivity curable resin according to claim 9, wherein light transmittance is 50% or more at 360 nm when a 3-methoxybutyl acetate solution of 20 wt. % as resinous solid content is put into a quartz cell of 1 cm square.

12. A high photo-sensitivity curable resin according to claim 1, wherein said isocyanate compound containing the radical polymerizable group is introduced into the principal chain part of said high photo-sensitivity curable resin with a polymerization inhibitor selected from the group of phenol compounds shown in the following formula (9) and phosphate compounds shown in the following formula (15):

Formula (9)

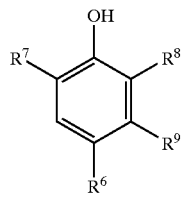

wherein $R^6$ is hydrogen, alkyl having 1 to 5 carbon atoms or the following formula (10):

Formula (10)

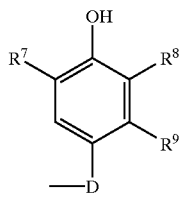

wherein D is —S—, alkylene having 1 to 10 carbon atoms or alkylidene of 1 to 10 carbon atoms, $R^7$ is hydrogen or alkyl having 1 to 10 carbon atoms, and $R^8$ is hydrogen, alkyl having 1 to 10 carbon atoms or the following formula (11):

Formula (11)

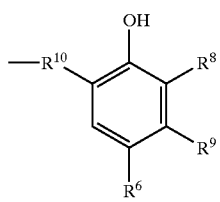

wherein $R^{10}$ is alkylene having 1 to 10 carbon atoms or alkylidene having 1 to 10 carbon atoms, and $R^9$ is hydrogen or alkyl having 1 to 10 carbon atoms: However, at least one of $R^7$ and $R^8$ is a tertiary butyl or alkyl having a cyclohexyl, and substituents indicated with the same code may be the same one or different each other:

Formula (15)

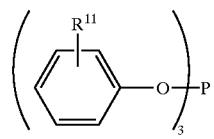

wherein $R^{11}$ is hydrogen or alkyl having 1 to 20 carbon atoms.

13. A photo-curable resin composition containing a high photo-sensitivity curable resin according to claim 1 as an essential component.

14. A photo-curable resin composition according to claim 13, wherein a minimum exposure amount of said photo-curable resin composition is 100 mJ/cm$^2$ or less when said photo-curable resin composition is applied on a base plate and pre-baked to form a coated film, the coated film is exposed and the film thickness is measured (the film thickness before development), then the exposed coated film is developed and the film thickness is measured again after post-baking (the final film thickness after hardening), and the residual film rate is measured according to the following equation, Residual film rate (%)=(final film thickness after hardening ($\mu$m)÷film thickness before development ($\mu$m))×100, on the other hand, the same photo-curable resin composition is applied on a base plate in the same conditions as those for measuring the residual film rate, the film thickness is measured after the coated film is pre-baked and completely hardened by exposing (the completely exposed film thickness), then the exposed coated film is post-baked with no developing process in the same conditions as those for measuring the residual film rate, and the film thickness is measured again (the final film thickness without the developing process), and the reference residual film rate is measured according to the following equation, Reference residual film rate (%)=(final film thickness without the developing process ($\mu$m)÷completely exposed film thickness ($\mu$m))×100, thus minimum exposure amount is defined as the smallest exposure amount making the calculated residual film rate equal to the reference residual film rate, provided that the error limit is 1%.

15. A color filter comprising a transparent substrate, a color layer disposed on said transparent substrate, and a protection film coating said color layer, wherein at least one of said color layer and said protection film is formed by hardening a photo-curable resin composition according to claim 14.

16. A color filter comprising a transparent substrate, a color layer disposed on said transparent substrate, and a spacer disposed at a position to be superimposed with a non-display part for maintaining a distance with respect to an electrode substrate to be faced therewith, wherein said spacer is formed by hardening a photo-curable resin composition according to claim 14.

17. A color filter comprising a transparent substrate, a color layer disposed on said transparent substrate, and a protection film coating said color layer, wherein at least one of said color layer and said protection film is formed by hardening a photo-curable resin composition according to claim 13.

18. A liquid crystal display panel, wherein a color filter according to claim 17 and an electrode substrate are opposed each other and a liquid crystal compound is sealed therebetween.

19. A color filter comprising a transparent substrate, a color layer disposed on said transparent substrate, and a spacer disposed at a position to be superimposed with a non-display part for maintaining a distance with respect to an electrode substrate to be faced therewith, wherein said spacer is formed by hardening a photo-curable resin composition according to claim 13.

20. A liquid crystal display panel, wherein a color filter according to claim 19 and an electrode substrate are opposed each other and a liquid crystal compound is sealed therebetween.

21. A high photo-sensitivity curable resin comprising a polymer having a principal chain which comprises a constitutional unit having an acid functional group and a constitutional unit having a hydroxyl group, wherein an isocyanate compound containing a radical polymerizable group is amide-bonded with at least a part of said acid functional group via an isocyanate group of the isocyanate compound and/or urethane-bonded with at least a part of said hydroxyl group via the isocyanate group of said isocyanate compound, the introduced amount of said isocyanate compound containing the radical polymerizable group to 100 mol of said constitutional unit of the principal chain is 8 mol or more when measured with $^1$H-NMR after removing components of 5,000 or less in molecular weight.

22. A high photo-sensitivity curable resin according to claim 21, wherein said principal chain comprises a constitutional unit shown in the following formula (1) and a constitutional unit shown in the following formula (2):

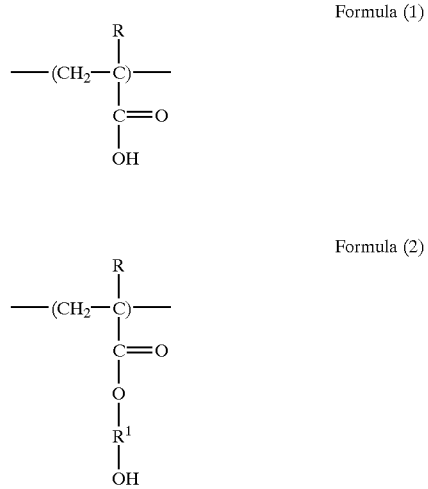

wherein R is hydrogen or alkyl having 1 to 5 carbon atoms, and $R^1$ is alkylene having 2 to 4 carbon atoms.

23. A high photo-sensitivity curable resin according to claim 21, wherein an alcohol is ester-bonded with at least a part of acid functional group in said principal chain via a hydroxyl group of said alcohol.

24. A high photo-sensitivity curable resin according to claim 21, wherein the principal chain part of said high photo-sensitivity curable resin is formed by polymerizing a compound having a double bond containing group and an acid functional group and a compound having a double bond containing group and a hydroxyl group with a non-nitrile-based azo polymerization initiator or a peroxide-based polymerization initiator.

25. A high photo-sensitivity curable resin according to claim 24, wherein light transmittance is 60% or more at 400 nm when a 3-methoxybutyl acetate solution of 20 wt. % as resinous solid content is put into a quartz cell of 1 cm square.

26. A high photo-sensitivity curable resin according to claim 24, wherein light transmittance is 50% or more at 360 nm when a 3-methoxybutyl acetate solution of 20 wt. % as resinous solid content is put into a quartz cell of 1 cm square.

27. A high photo-sensitivity curable resin according to claim 21, wherein said isocyanate compound containing the radical polymerizable group is introduced into the principal chain part of said high photo-sensitivity curable resin with a polymerization inhibitor selected from the group of phenol compounds shown in the following formula (9) and phosphate compounds shown in the following formula (15):

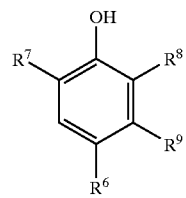

wherein $R^6$ is hydrogen, alkyl having 1 to 5 carbon atoms or the following formula (10):

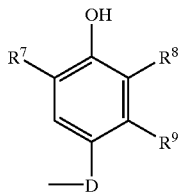

wherein D is —S—, alkylene having 1 to 10 carbon atoms or alkylidene of 1 to 10 carbon atoms, $R^7$ is hydrogen or alkyl having 1 to 10 carbon atoms, and $R^8$ is hydrogen, alkyl having 1 to 10 carbon atoms or the following formula (11):

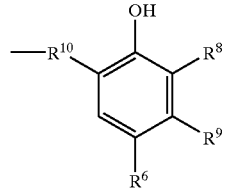

wherein $R^{10}$ is alkylene having 1 to 10 carbon atoms or alkylidene having 1 to 10 carbon atoms, and $R^9$ is hydrogen or alkyl having 1 to 10 carbon atoms: However, at least one of $R^7$ and $R^8$ is a tertiary butyl or alkyl having a cyclohexyl, and substituents indicated with the same code may be the same one or different each other:

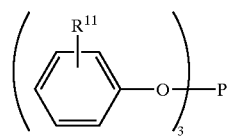

wherein $R^{11}$ is hydrogen or alkyl having 1 to 20 carbon atoms.

28. A production method of a high photo-sensitivity curable resin, wherein an isocyanate compound containing a radical polymerizable group is reacted with a raw material polymer having a principal chain comprising a constitutional unit having an acid functional group and a constitutional unit having a hydroxyl group at the rate of 1.0 or more in terms of equivalent ratio of the isocyanate group in said isocyanate compound to the hydroxyl group in said principal chain (NCO/OH).

29. A production method of a high photo-sensitivity curable resin according to claim 28, wherein said isocyanate compound containing the radical polymerizable group is reacted with said raw material polymer at the rate of 1.2 or more in terms of said equivalent ratio (NCO/OH).

30. A production method of a high photo-sensitivity curable resin according to claim 28, wherein said equivalent ratio (NCO/OH) is 2.0 or less.

31. A production method of a high photo-sensitivity curable resin according to claim 28, wherein a feed amount of said constitutional unit having the hydroxyl group is 14 mol % or more on the basis of the total amount of each constitutional unit constituting the principal chain and side chains of said high photo-sensitivity curable resin.

32. A production method of a high photo-sensitivity curable resin according to claim 31, wherein the feed amount of said constitutional unit having the acid functional group is 10 to 30 mol %, that of said constitutional unit having the hydroxyl group is 14 mol % or more, and that of said isocyanate compound containing the radical polymerizable group is 14 mol % or more on the basis of the total amount of each constitutional unit constituting the principal chain and side chains of said high photo-sensitivity curable resin.

33. A production method of a high photo-sensitivity curable resin according to claim 32, wherein the feed amount of said constitutional unit having the acid functional group is 10 to 30 mol %, that of said constitutional unit having the hydroxyl group is 15 to 19 mol %, and that of said isocyanate compound containing the radical polymerizable group is 18 to 26 mol % on the basis of the total amount of each constitutional unit constituting the principal chain and side chains of said high photo-sensitivity curable resin.

34. A production method of a high photo-sensitivity curable resin according to claim 28, wherein said principal chain comprises a constitutional unit shown in the following formula (1) and a constitutional unit shown in the following formula (2):

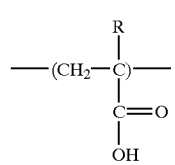

Formula (1)

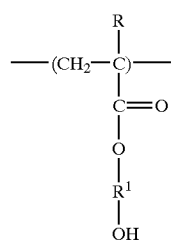

Formula (2)

wherein R is hydrogen or alkyl having 1 to 5 carbon atoms, and $R^1$ is alkylene having 2 to 4 carbon atoms.

35. A production method of a high photo-sensitivity curable resin according to claim 28, wherein said isocyanate compound containing the radical polymerizable group is reacted with said raw material polymer by dropping the isocyanate compound into a solution in which said raw material polymer is dissolved or dispersed.

36. A production method of a high photo-sensitivity curable resin according to claim 28, wherein after reacting said isocyanate compound with said raw material polymer, an alcohol is further reacted.

37. A production method of a high photo-sensitivity curable resin according to claim 28, wherein said raw material polymer is prepared by polymerizing a compound having a double bond containing group and an acid functional group and a compound having a double bond containing group and a hydroxyl group with a non-nitrile-based azo polymerization initiator or a peroxide-based polymerization initiator, and then said isocyanate compound is reacted with said raw material polymer.

38. A production method of a high photo-sensitivity curable resin according to claim 37, wherein it is possible to obtain a high photo-sensitivity curable resin having light transmittance of 60% or more at 400 nm when a 3-methoxybutyl acetate solution of 20 wt. % as resinous solid content is put into a quartz cell of 1 cm square.

39. A production method of a high photo-sensitivity curable resin according to claim 37, wherein it is possible to obtain a high photo-sensitivity curable resin having light transmittance of 50% or more at 360 nm when a 3-methoxybutyl acetate solution of 20 wt. % as resinous solid content is put into a quartz cell of 1 cm square.

40. A production method of a high photo-sensitivity curable resin according to claim 28, wherein said isocyanate compound containing the radical polymerizable group is reacted with said raw material polymer by using a polymerization inhibitor selected from the group of phenol compounds shown in the following formula (9) and phosphite compounds shown in the following formula (15):

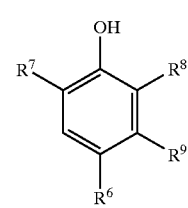

Formula (9)

wherein $R^6$ is hydrogen, alkyl having 1 to 5 carbon atoms or the following formula (10):

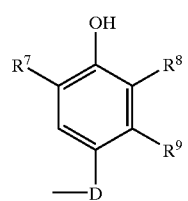

Formula (10)

wherein D is —S—, alkylene having 1 to 10 carbon atoms or an alkylidene having 1 to 10 carbon atoms, $R^7$ is hydrogen or alkyl having 1 to 10 carbon atoms, and $R^8$ is hydrogen, alkyl having 1 to 10 carbon atoms or the following formula (11):

Formula (11)

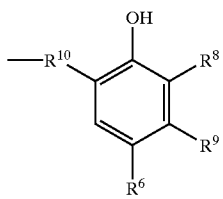

wherein $R^{10}$ is alkylene having 1 to 10 carbon atoms or alkylidene having 1 to 10 carbon atoms, and $R^9$ is hydrogen or alkyl having 1 to 10 carbon atoms: However, at least one of $R^7$ and $R^8$ is a tert-butyl or alkyl having a cyclohexyl, and substituents indicated with the same code may be the same one or different each other:

Formula (15)

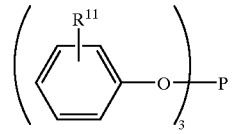

wherein $R^{11}$ is hydrogen or alkyl having 1 to 20 carbon atoms.

* * * * *